(12) United States Patent
Kagata et al.

(10) Patent No.: US 7,859,048 B2
(45) Date of Patent: Dec. 28, 2010

(54) SEMICONDUCTOR DEVICE HAVING SUPER JUNCTION

(75) Inventors: Yuma Kagata, Kariya (JP); Jun Sakakibara, Nagoya (JP); Hitoshi Yamaguchi, Nisshin (JP)

(73) Assignee: Denso Corporation, Kariya (JP)

( * ) Notice: Subject to any disclaimer, the term of this patent is extended or adjusted under 35 U.S.C. 154(b) by 219 days.

(21) Appl. No.: 12/314,786

(22) Filed: Dec. 16, 2008

(65) Prior Publication Data

US 2009/0321819 A1 Dec. 31, 2009

(30) Foreign Application Priority Data

Dec. 17, 2007 (JP) ................ 2007-325175

(51) Int. Cl.
*H01L 29/68* (2006.01)
(52) U.S. Cl. ................ 257/330; 257/E29.262
(58) Field of Classification Search ............ 257/330, 257/E29.262
See application file for complete search history.

(56) References Cited

U.S. PATENT DOCUMENTS

2007/0177444 A1* 8/2007 Miyajima ................ 365/221
2008/0017897 A1* 1/2008 Saito et al. ............... 257/288

FOREIGN PATENT DOCUMENTS

JP        A-2004-72068        3/2004

OTHER PUBLICATIONS

Office Action dated Oct. 23, 2009 in the corresponding Chinese patent application No. 2008101856536 (English translation enclosed).

\* cited by examiner

*Primary Examiner*—Sue Purvis
*Assistant Examiner*—W. Wendy Kuo
(74) *Attorney, Agent, or Firm*—Posz Law Group, PLC

(57) ABSTRACT

A semiconductor device includes: a first semiconductor layer; a PN column layer having first and second column layers; and a second semiconductor layer. Each of the first and second column layers includes first and second columns alternately arranged along with a horizontal direction. The first and second column layers respectively have first and second impurity amount differences defined at a predetermined depth by subtracting an impurity amount in the second column from an impurity amount in the first column. The first impurity amount difference is constant and positive. The second impurity amount difference is constant and negative.

10 Claims, 15 Drawing Sheets

US 7,859,048 B2

SEMICONDUCTOR DEVICE HAVING SUPER JUNCTION

CROSS REFERENCE TO RELATED APPLICATION

This application is based on Japanese Patent Application No. 2007-325175 filed on Dec. 17, 2007, the disclosure of which is incorporated herein by reference.

FIELD OF THE INVENTION

The present invention relates to a semiconductor device having a super junction.

BACKGROUND OF THE INVENTION

In recent years, a semiconductor device has been known in the field of semiconductor devices used in power applications. This vertical semiconductor device makes it possible to achieve both the enhancement of breakdown voltage and the reduction of on-state resistance and has a PN column layer that functions as a super junction (SJ) as a drift layer. This semiconductor device will be hereafter abbreviated as SJ-MOS transistor. The SJ-MOS transistor is disclosed in, for example, JP-A-2004-72068 (i.e., Patent Document 1).

FIGS. 22A and 22B are sectional views schematically illustrating a conventional typical SJ-MOS transistor 90. FIG. 22A illustrates the repetitive unit structure of the SJ-MOS transistor 90 and FIG. 22B illustrates the SJ-MOS transistor 90 comprised of the unit structures in FIG. 22A. When the unit structure illustrated in FIG. 22A is sequentially inverted at the axes of symmetry A1-A1, A2-A2 indicated by alternate long and short dash lines and repeated, the SJ-MOS transistor 90 illustrated in FIG. 22B is constructed.

The SJ-MOS transistor 90 illustrated in FIGS. 22A and 22B is an N-channel SJ-MOS transistor and uses a silicon substrate composed of an N-type (n$^+$) semiconductor layer 1 as a drain region. Over the N-type semiconductor layer 1, a PN column layer 10 having a thickness of d is formed. The PN column layer is formed by alternately and repetitively disposing an N-type column 20n and a P-type column 20P, identical in impurity concentration (i.e., $X0_n = X0_p$) and width (i.e., $W0_n = W0_p$) with each other, that are epitaxial layers composed of silicon. The columns are abutted against one another. Over the PN column layer 10, a P-type (p$^-$) semiconductor layer (i.e., a base region) 3 that is an epitaxial layer composed of silicon and functions as a channel formation layer is formed. In other words, the SJ-MOS transistor 90 is a semiconductor device constructed as illustrated in FIG. 22B. That is, the N-type semiconductor layer 1 is formed in abutment with a first interface B1 of the PN column layer 10 and the P-type semiconductor layer 3 is formed in abutment with a second interface B2 of the PN column layer 10.

In the surface part of the P-type semiconductor layer 3, an N-type (n$^+$) region 4 as a source region is selectively formed. A P-type (p$^+$) region 3a connected to a source electrode in common next to the N-type region 4 is a contact region formed to fix the potential of the P-type semiconductor layer 3. An insulating gate electrode 7 of trench structure comprised of a side wall insulating film 5 and buried polycrystalline silicon 6 is formed next to the N-type region 4 so that it penetrates the P-type semiconductor layer 3. Though not shown in the drawings, the N-type columns 20n, P-type columns 20p, N-type regions 4, P-type regions 3a and insulating gate electrodes 7 in the SJ-MOS transistor 90 are arranged in a stripe pattern perpendicular to the surfaces of FIGS. 22A and 22B in the substrate surface.

The SJ-MOS transistor 90 illustrated in FIGS. 22A and 22B is characterized in that it has the PN column layer 10 that functions as a super junction. This makes it a semiconductor element excellent in achieving both the enhancement of breakdown voltage and the reduction of on resistance as compared with conventional vertical MOS transistors (DMOS transistors) without a PN column layer. More specific description will be given. In the SJ-MOS transistor 90, the N-type columns 20n of the PN column layer 10 function as a drift layer when the transistor is turned on. The P-type columns 20p have a function of expanding a depletion layer to the N-type columns 20n that are a current path when the transistor is off. In a DMOS transistor without a P-type column, a problem arises when the concentration of the N-type layer as a drift layer is increased. The depletion layer is not expanded and the breakdown voltage is lowered. In the SJ-MOS transistor 90 in FIGS. 22A and 22B, meanwhile, the following can be implemented even when the N-type columns 20n as a drift layer is increased in impurity concentration and lowered in on resistance: when the transistor is off, the depletion layer can be expanded to the N-type columns 20n by appropriately setting the impurity concentration of the P-type columns 20p and the like; and thus both the enhancement of breakdown voltage and the reduction of on resistance can be achieved.

[Patent Document 1] JP-A-2004-72068

To obtain a high breakdown voltage in the SJ-MOS transistor 90 in FIGS. 22A and 22B, as mentioned above, it is required to expand the depletion layer to the N-type columns 20n as a drift layer. To expand the depletion layer to the N-type columns 20n, the following condition is imposed: "the impurity amount (=concentration×volume) of the N-type columns 20n and the impurity amount (=concentration×volume) of the P-type columns 20P shall be made equal to each other." The PN column layer 10 is designed so as to meet this condition. However, there is a problem. If variation in shape processing or variation in impurity concentration (hereafter, collectively referred to as variation in formation) is produced when the PN column layer 10 is formed, the above condition cannot be met. For this reason, the expansion of the depletion layer in the drift layer is prevented by a surplus of the impurity amount of the N-type columns 20n or the P-type columns 20p and the breakdown voltage of the SJ-MOS transistor 90 is lowered. The reduction in breakdown voltage due to the above variation in formation becomes more apparent as the on resistance of the SJ-MOS transistor 90 is reduced. That is, since the impurity amount of the N-type columns 20n is increased to reduce on resistance, it is required to similarly increase the impurity amount of the P-type columns 20p as well. As a result, variation in a surplus of impurities caused by variation in formation is relatively increased. For this reason, variation in breakdown voltage is more increased by the above variation in formation as the impurity amount of the N-type columns 20n is increased to reduce the on resistance of the SJ-MOS transistor 90.

To cope with the above problem specific to the SJ-MOS transistor, Patent Document 1 proposes a taper structure. In the semiconductor element disclosed in Patent Document 1, a taper angle is provided in the joint areas between the N-type columns and the P-type columns in a PN column layer. In this taper structure, the width of the N-type columns and the width of the P-type columns are varied in opposite directions from the principal surface side toward the back side in the PN column layer. In this structure, as a result, the impurity amount of the N-type columns and the impurity amount of the P-type columns are also varied in opposite directions. Therefore, even when the above variation in formation is produced, a region where the above condition of equal impurity amounts is met exists somewhere in the depth of the PN column layer. Thus the depletion layer can be expanded to the N-type columns in this region. Even in the above taper structure, however, a region where the above condition of equal impurity amounts is met is limited to some narrow region in the PN column layer and variation in breakdown voltage due to variation in formation is still large.

SUMMARY OF THE INVENTION

In view of the above-described problem, it is an object of the present disclosure to provide a semiconductor device having a PN column layer as a super junction with small breakdown voltage variation.

According to an aspect of the present disclosure, a semiconductor device includes: a first semiconductor layer having a first conductive type; a PN column layer disposed on the first semiconductor layer; and a second semiconductor layer having a second conductive type and disposed on the PN column layer. The PN column includes a first column layer and a second column layer. The first column layer is disposed on the first semiconductor layer, and the second column layer is disposed between the first column layer and the second semiconductor layer. Each of the first column layer and the second column layer includes a first column having the first conductive type and a second column having the second conductive type. The first column and the second column in the first column layer are alternately arranged along with a horizontal direction parallel to a first boundary between the PN column layer and the first semiconductor layer. The first column and the second column in the second column layer are alternately arranged along with the horizontal direction parallel to a second boundary between the PN column layer and the second semiconductor layer. The first column layer has a first impurity amount difference, which is defined at a predetermined depth from the first boundary by subtracting an impurity amount in the second column from an impurity amount in the first column. The second column layer has a second impurity amount difference, which is defined at a predetermined depth from a second boundary between the PN column layer and the second semiconductor layer by subtracting an impurity amount in the second column from an impurity amount in the first column. The first impurity amount difference is constant and positive, and the second impurity amount difference is constant and negative.

The semiconductor device has a high breakdown voltage and a low on-state resistance. Further, variation of a breakdown voltage in the semiconductor device is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

A vertical semiconductor device (hereafter, abbreviated as SJ-MOS transistor) has a PN column layer that functions as a super junction (SJ) as a drift layer. The semiconductor device with the PN column layer formed therein can be formed as a semiconductor device that makes it possible to achieve both the improvement of breakdown voltage and the reduction of on resistance.

First Embodiment

Figure 1A:
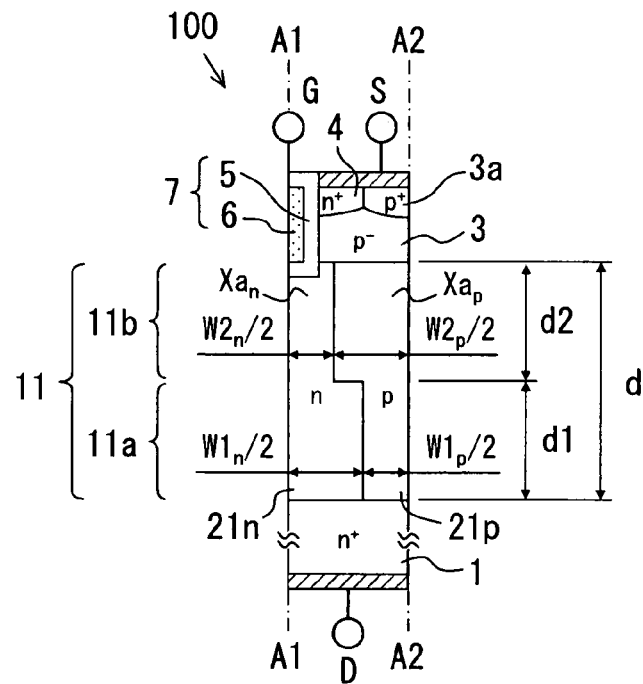
FIG. 1A is a partial sectional view schematically illustrating SJ-MOS transistor as an example of a first embodiment and illustrates the repetitive unit structure of the SJ-MOS transistor.
Figure 1B:
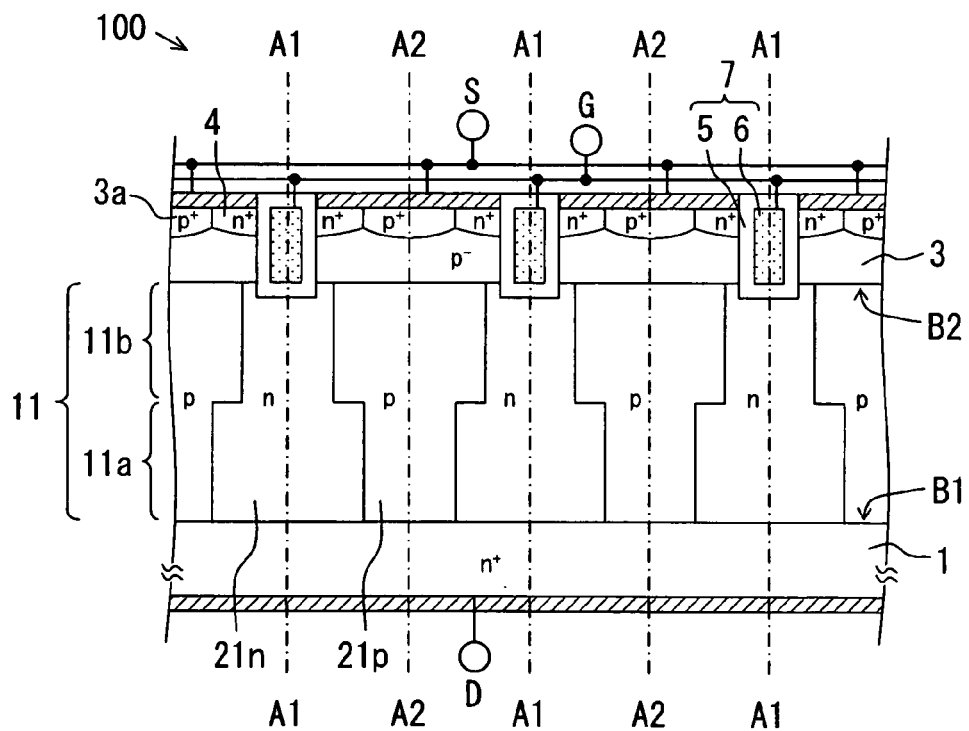
FIG. 1B is a sectional view schematically illustrating the SJ-MOS transistor constructed of the unit structures in FIG. 1A.

FIGS. 1A and 1B are sectional views schematically illustrating a semiconductor device (hereafter, abbreviated as SJ-MOS transistor) 100 as an example of this embodiment. FIG. 1A illustrates the repetitive unit structure of the SJ-MOS transistor 100 and FIG. 1B illustrates the SJ-MOS transistor 100 constructed of the unit structures in FIG. 1A. In the SJ-MOS transistor 100 illustrated in FIGS. 1A and 1B. When the unit structure illustrated in FIG. 1A is sequentially inverted at the axes of symmetry A1-A1, A2-A2 indicated by alternate long and short dash lines and repeated, the SJ-MOS transistor 100 illustrated in FIG. 1B is constructed.

Figure 22A:
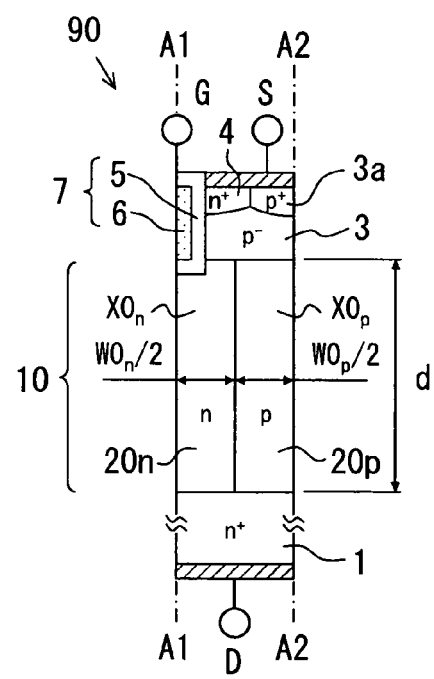
FIG. 22A is a sectional view schematically illustrating a conventional typical SJ-MOS transistor and illustrates the repetitive unit structure of the SJ-MOS transistor.
Figure 22B:
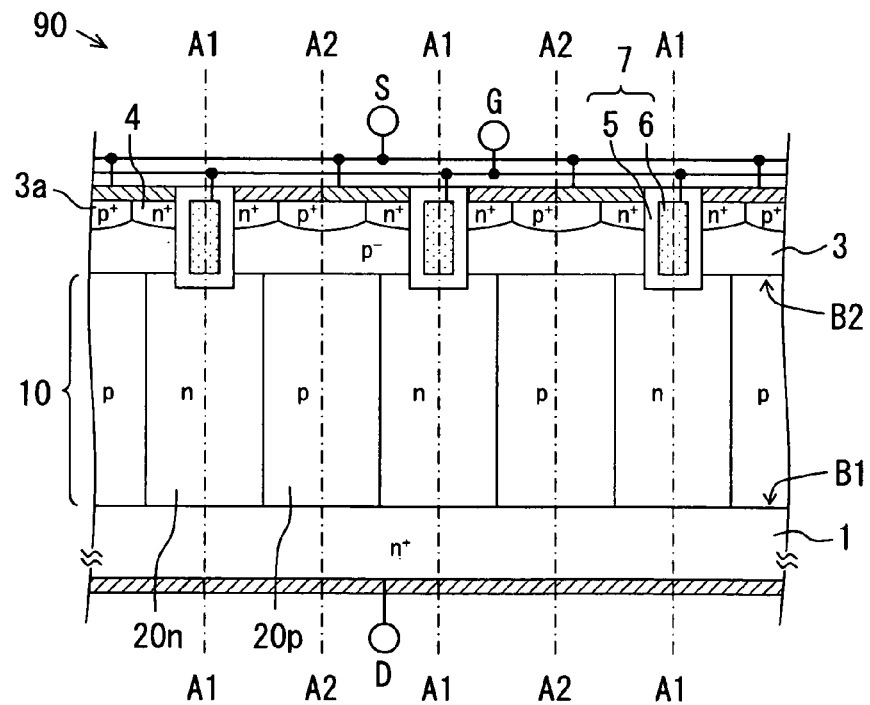
FIG. 22B is a sectional view schematically illustrating the SJ-MOS transistor constructed of the unit structures in FIG. 22A.

The SJ-MOS transistor 100 illustrated in FIGS. 1A and 1B is the same N-channel SJ-MOS transistor as the SJ-MOS transistor 90 illustrated in FIGS. 22A and 22B. In the SJ-MOS transistor 100 illustrated in FIGS. 1A and 1B, a silicon substrate comprised of an N-type ($n^+$) semiconductor layer 1 is used as a drain region. The SJ-MOS transistor 100 is provided over the entire back side thereof with a drain electrode (D) filled in with black. Over the N-type semiconductor layer 1, there is formed a PN column layer 11 having a thickness of d. The PN column layer is formed by alternately and repetitively disposing an N-type (n) column 21n having an impurity concentration of $Xa_n$ and a P-type (p) column 21p having an impurity concentration of $Xa_p$ which are epitaxial layers composed of silicon. The N-type (n) columns 21n and the P-type (p) columns 21p are abutted against each other. Over the PN column layer 11, there is formed a P-type ($p^-$) semiconductor layer (base region) 3 that is an epitaxial layer composed of silicon and functions as a channel formation layer. In other words, the SJ-MOS transistor 100 is a semiconductor device in which the following is implemented as illustrated in FIG. 1B: the N-type semiconductor layer 1 is formed in abutment with a first interface B1 of the PN column layer 11 and the P-type semiconductor layer 3 is formed in abutment with a second interface B2 of the PN column layer 11. In the surface part of the P-type semiconductor layer 3, an N-type ($n^+$) region 4 that is a source region is selectively formed. A P-type ($p^+$) region 3a connected to a source electrode (S) filled in with black in common next to the N-type region 4 is a contact region formed to fix the potential of the P-type semiconductor layer 3. An insulating gate (G) electrode 7 of trench structure comprised of a side wall insulating film 5 and buried polycrystalline silicon 6 is formed next to the N-type region 4 so that it penetrates the P-type semiconductor layer 3. Though not shown in the drawings, the N-type columns 21n, P-type columns 21p, N-type regions 4, P-type regions 3a, and insulating gate electrodes 7 in the SJ-MOS transistor 100 are arranged in a stripe pattern perpendicular to the surfaces of FIGS. 1A and 1B.

In the PN column layer 10 of the SJ-MOS transistor 90 illustrated in FIGS. 22A and 22B, the N-type columns 20n and the P-type columns 20p are so formed that they are identical with each other in impurity concentration ($X0_n=X0_p$) and width ($W0_n=W0_p$). Meanwhile, the PN column layer 11 of the SJ-MOS transistor 100 illustrated in FIGS. 1A and 1B is provided with: the first column layer 11a so formed that its width from the first interface B1 is a predetermined value d1; and the second column layer 11b so formed that its thickness from the second interface B2 is a predetermined value d2. In the PN column layer 11, the difference D in impurity amount as a function of depth will be defined as: (the impurity amount of the N-type columns 21n)−(the impurity amount of the P-type columns 21p). At this time, the first column layer 11a is a layer whose difference D in impurity amount at an arbitrary depth is set to a certain positive value Da (>0); and the second column layer 11b is a layer whose difference D in impurity amount at an arbitrary depth is set to a certain negative value Db (<0). In other words, the PN column layer 11 in the SJ-MOS transistor 100 in FIGS. 1A and 1B is so structured that it has the following layers: the first column layer 11a that is abutted against the N-type semiconductor layer 1 and in which the balance of impurity amount is swung to a certain degree so that it is rich with the N-type impurity; and the second column layer 11b that is abutted against the P-type semiconductor layer 3 and in which the balance of impurity amount is swung to a certain degree so that it is rich with the P-type impurity. The thicknesses d1, d2 of and the differences Da, Db in impurity amount of the first column layer 11a and the second column layer 11b in the PN column layer 11 can be appropriately set. In the SJ-MOS transistor 100 in FIGS. 1A and 1B, any surplus of impurity amount caused by variation in shape processing or variation in impurity concentration (hereafter, collectively referred to as variation in formation) is canceled as follows: it is canceled by forming the first column layer 11a and the second column layer 11b in the PN column layer 11 and breaking down the balance of impurity amount in the direction of depth beforehand. In the SJ-MOS transistor 100 illustrated in FIGS. 1A and 1B, as a result, variation in breakdown voltage due to the above variation in formation can be reduced more than in the following conventional semiconductor devices: the SJ-MOS transistor 90 illustrated in FIGS. 22A and 22B in which the difference in impurity amount is zeroed in the entire PN column layer 10 in the direction of thickness; and the SJ-MOS transistor disclosed in Patent Document 1 in which the joint areas between the N-type columns and the P-type columns are provided with a taper structure to zero the difference in impurity amount in some narrow region. Therefore, the SJ-MOS transistor 100 in FIGS. 1A and 1B makes it possible to enhance the percentage of non-defectives with respect to breakdown voltage as compared with conventional SJ-MOS transistors as described in detail below.

The difference D in impurity amount of the PN column layer in the above SJ-MOS transistor can be set to an arbitrary value by setting the width W and impurity concentration X of the N-type columns and the P-type columns as a function of depth. In the description of this embodiment, a case where the following measure is taken will be taken as an example: the impurity concentrations of the N-type columns and the P-type columns are respectively set to a certain value and the differences D in impurity amount are set by the widths W of the N-type columns and the P-type columns.

In the SJ-MOS transistor 100 in FIGS. 1A and 1B, as mentioned above, the P-type columns 21p and the N-type column 21n are respectively set to certain impurity concentrations $Xa_p$, $Xa_n$. Meanwhile, the widths of the P-type columns 21p and the N-type columns 21n are not constant in the entire PN column layer 10 in the direction of depth. In the first column layer 11a, they are respectively set to $W1_p$ and $W1_n$ and in the second column layer 11b, they are respectively set to $W2_p$ ($>W1_p$) and $W2_n$ ($<W1_n$). Therefore, the SJ-MOS transistor 100 in FIGS. 1A and 1B is so constructed that the following is implemented: the difference Da in impurity amount of the first column layer 11a and the difference Db in impurity amount of the second column layer 11b are set by the differences in width $W1_p$, $W2_p$ and $W1_n$, $W2_n$ of the P-type columns 21p and the N-type columns 21n as a function of depth. That is, the following relation holds in the respective column layers as indicated by the mathematical expressions in FIG. 1A: $Da \propto (Xa_n \cdot W1_n - Xa_p \cdot W1_p) > 0$ in the first column layer 11a and $Db \propto (Xa_n \cdot W2_n - Xa_p \cdot W2_p) < 0$ in the second column layer 11b. Here, $Xa_p = Xa_n$, $|W1_n - W1_p| = |W2_n - W2_p|$, and $d1 = d2 = d/2$.

The SJ-MOS transistor 90 in FIGS. 22A and 22B and the SJ-MOS transistor 100 in FIGS. 1A and 1B will be compared with each other based on a more concrete example. The impurity concentrations $X0_p$, $X0_n$ in the PN column layer of the SJ-MOS transistor 90 and the impurity concentrations $Xa_p$, $Xa_n$ in the PN column layer 11 of the SJ-MOS transistor 100 are all equally set. ($X0p = X0_n = Xa_p = Xa_n$). In this case, the above difference D in impurity concentration is determined by only the relation of the widths of the P-type columns 20p, 21p and the N-type columns 20n, 21n in the PN column layers 10, 11. In the SJ-MOS transistor 90 in FIGS. 22A and 22B, $W0_n = W0_p$; therefore, it is zero at an arbitrary depth in the PN column layer 10. In the SJ-MOS transistor 100 in FIGS. 1A and 1B, the thicknesses and widths of the first column layer 11a and the second column layer 11b are so set that $d1 = d2 = d/2$ and $|W1_n - W1_p| = |W2_n - W2_p|$. The above differences Da, Db in impurity amount of the first column layer 11a and the second column layer 11b are equal in absolute value and different from each other only in positive/negative sign. In the second column layer 11b on the principal surface side, the P-type impurity amount is larger than the N-type impurity amount and in the first column layer 11a on the back side, the N-type impurity amount is larger than the P-type impurity amount. In an element in the range of breakdown voltage of 600V, the thickness d of the PN column layer 10, 11 equivalent to the length of the drift region is 50 µm or so. The impurity concentration of the P-type columns $20_p$, 21p and the N-type columns $20_n$, 21n is $5.0 \times 10^{15}$ cm$^{-3}$ to $1.0 \times 10^{17}$ cm$^{-3}$.

Figure 2:
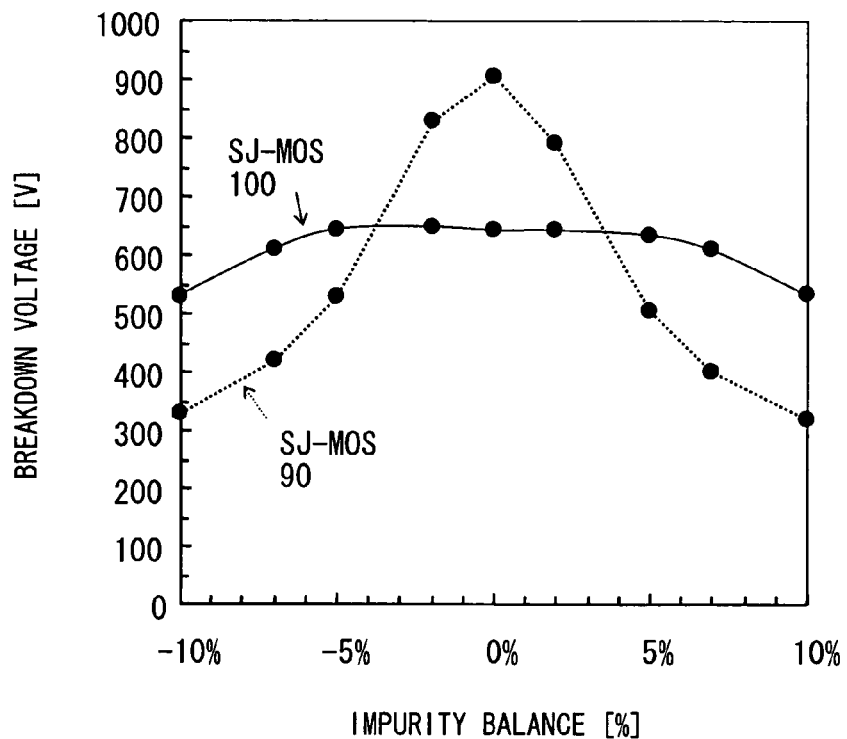
FIG. 2 is a drawing illustrating the result of simulation on SJ-MOS transistor and the comparison SJ-MOS transistor and illustrates the dependence of breakdown voltage on the balance of impurity amount.

FIG. 2 illustrates the result of simulation on the SJ-MOS transistor 90 and the SJ-MOS transistor 100 related to the above concrete example and compares them for the dependence of breakdown voltage on the balance of impurity amount. The $(Da - W2_n)/(W1_n + W2_n)$ of the SJ-MOS transistor 100 is set to 7%. The balance of impurity amount on the horizontal axis is on the assumption that there is variation in impurity concentration. This variation is produced by keeping the impurity concentrations of the N-type columns 20n, 21n constant and varying the impurity concentrations of the P-type columns 20p, 21p.

As illustrated in FIG. 2, the following takes place in the conventional SJ-MOS transistor 90: when the impurity amount is balanced (0%), as high a breakdown voltage as approximately 900V is obtained; but when the balance of impurity amount is broken down from 0%, the breakdown voltage is drastically lowered. In the SJ-MOS transistor 100, meanwhile, the following takes place: when the impurity amount is balanced (0%), the maximum breakdown voltage is lower than in the SJ-MOS transistor 90; however, a required breakdown voltage of 600V or above can be obtained over a wider range, −7% to +7%, of the balance of impurity amount in which the impurity amount is out of balance. In other words, the SJ-MOS transistor 100 is smaller in variation in breakdown voltage than the conventional SJ-MOS transistor 90 even though there is manufacture variation with respect to impurity concentration and is an element advantageous for the enhancement of percentage of non-defectives.

Figure 3:
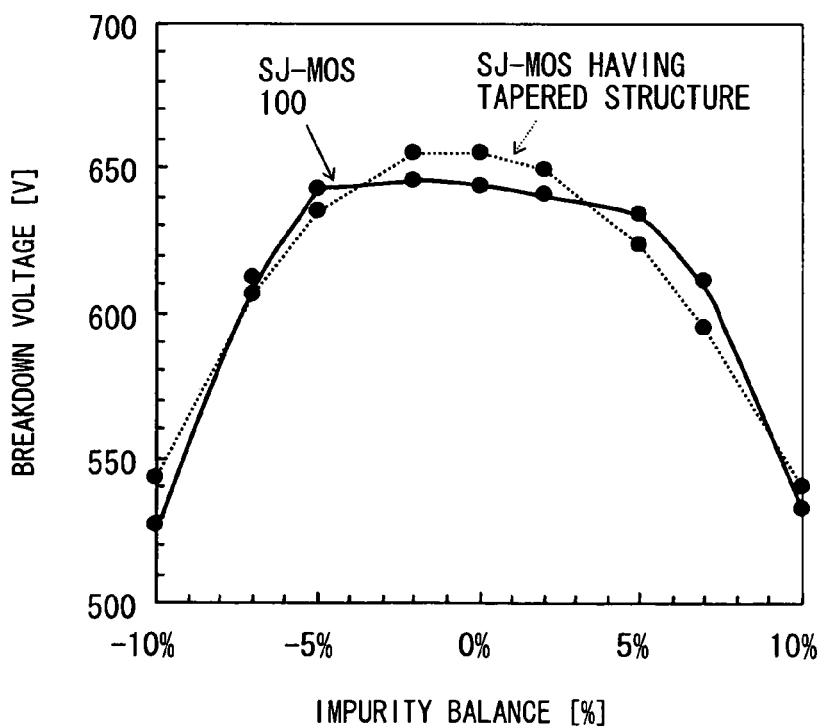
FIG. 3 is a drawing illustrating the dependence of breakdown voltage on the balance of impurity amount of the SJ-MOS transistor and the dependence on the balance of impurity amount of SJ-MOS transistor in which the PN column layer is of taper structure by comparison.

FIG. 3 compares the dependence of breakdown voltage on the balance of impurity amount in the SJ-MOS transistor 100 and the dependence on the balance of impurity amount in SJ-MOS transistor whose PN column layer is constructed in taper structure as in Patent Document 1. As illustrated in FIG. 3, again, the SJ-MOS transistor 100 makes it possible to obtain a required breakdown voltage of 600V or above over the wider range of the balance of impurity amount than the SJ-MOS transistor whose PN column layer is of taper structure. In the SJ-MOS transistor 100, breakdown voltage does not vary so much even though there is manufacture variation with respect to impurity concentration and the SJ-MOS transistor 100 can be made an element advantageous for the enhancement of percentage of non-defectives.

Description will be given to the reason why the SJ-MOS transistor 100 is smaller in variation in breakdown voltage than the SJ-MOS transistor 90 as indicated in FIG. 2.

Figure 4A:
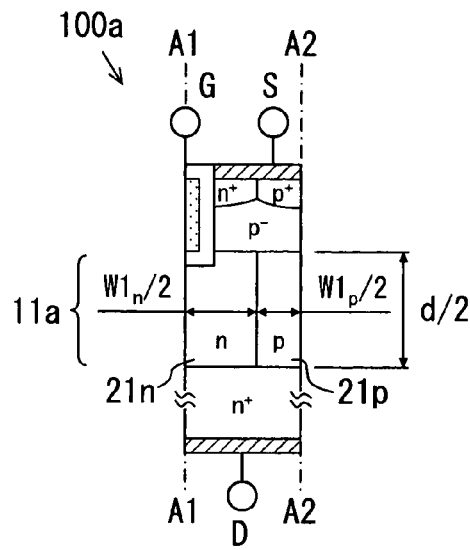
FIG. 4A is a drawing schematically illustrating the repetitive unit structure of SJ-MOS transistor obtained by constructing the first column layer of the SJ-MOS transistor in FIGS. 1A and 1B as a PN column layer.
Figure 4B:
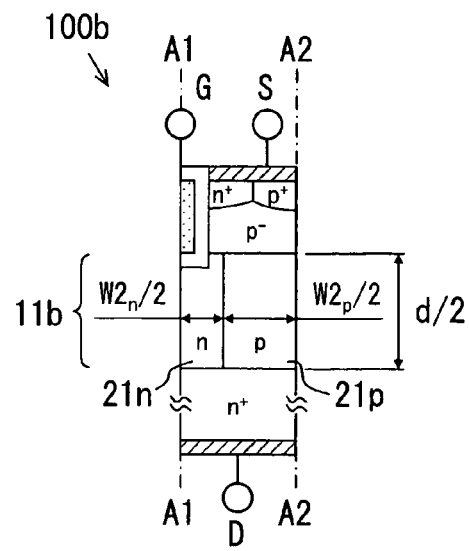
FIG. 4B is a drawing schematically illustrating the repetitive unit structure of SJ-MOS transistor obtained by constructing the second column layer of the SJ-MOS transistor in FIGS. 1A and 1B as a PN column layer.

FIGS. 4A and 4B schematically illustrate the repetitive unit structures of SJ-MOS transistors 100a, 100b obtained by respectively constructing the first column layer 11a and the second column layer 11b in the SJ-MOS transistor 100 in FIGS. 1A and 1B as a PN column layer. Therefore, as mentioned above, the drift regions of the SJ-MOS transistors 100a, 100b are equal in length and d/2=25 µm.

Figure 5:
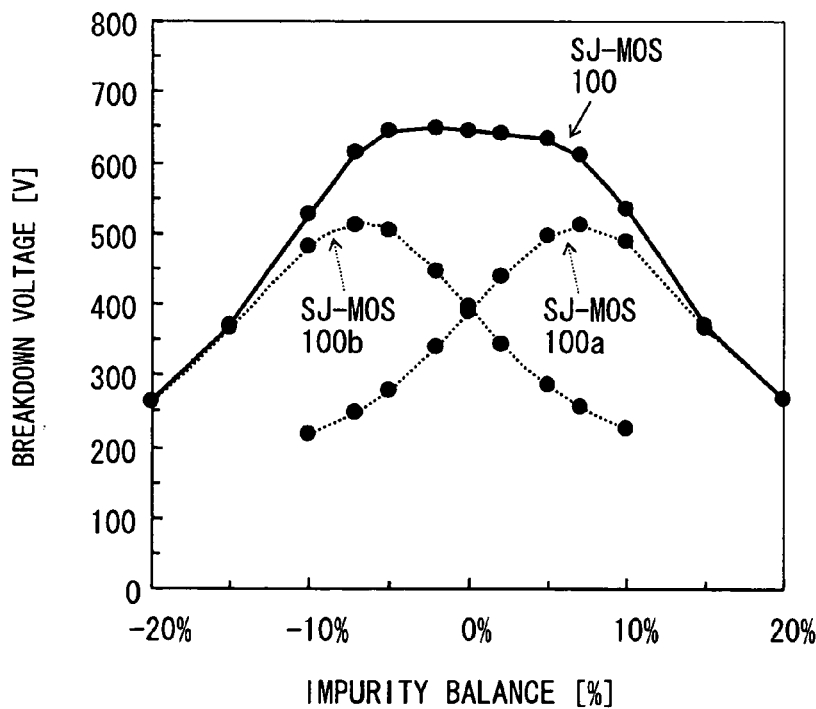
FIG. 5 is a drawing illustrating the result of simulation on the SJ-MOS transistors in FIGS. 4A and 4B and the SJ-MOS transistor in FIGS. 1A and 1B and illustrates the dependence of breakdown voltage on the balance of impurity concentration by comparison.

FIG. 5 illustrates the result of simulation on the SJ-MOS transistors 100a, 100b in FIGS. 4A and 4B and compares them for the dependence of breakdown voltage on the balance of impurity concentration. In FIG. 5, unlike FIG. 2, the horizontal axis indicates the balance of impurity concentration indicating a shift from when the N-type impurity concentration and the P-type impurity concentration are equal to each other. FIG. 5 indicates the result of simulation on the SJ-MOS transistor 100 in FIGS. 1A and 1B together.

With respect to the breakdown voltage of the SJ-MOS transistor 100a illustrated in FIG. 4A, the balance of impurity concentration is shifted to the positive side. The breakdown voltage takes the maximum value when the P-type impurity concentration is higher by approximately 7% than the N-type impurity concentration. The reason for this is as follows: the width $W1_n$ of the N-type column 21n is so set beforehand that it is wider than the width $W1_p$ of the P-type column 21p; when the balance of impurity concentration is 0%, therefore, the above-mentioned condition for expanding the depletion layer is not met, that is, the condition of "the impurity amounts (=concentration×volume) of the N-type columns 21n and the P-type column 21p shall be made equal to each other" is not met; and the condition is met when the balance of impurity concentration is shifted to the positive side by approximately 7%. For the same reason, the following takes place also with respect to the breakdown voltage of the SJ-MOS transistor 100b illustrated in FIG. 4B: the balance of impurity concentration is shifted to the negative side and the breakdown voltage takes the maximum value when the N-type impurity amount is higher by approximately 7% than the P-type impurity amount.

The PN column layer 11 as a drift region of the SJ-MOS transistor 100 illustrated in FIGS. 1A and 1B is of the structure obtained by joining the following in series in the direction in which voltage is applied, that is, in the direction of depth: the first column layer 11a as a drift region of the SJ-MOS transistor 100a illustrated in FIG. 4A; and the second column layer 11b as a drift region of the SJ-MOS transistor 100b illustrated in FIG. 4B. For this reason, as illustrated in FIG. 5, the dependence of breakdown voltage on the balance of impurity concentration in the SJ-MOS transistor 100 has a characteristic close to that of what obtained by combining the dependence of breakdown voltage on the balance of impurity concentration in the SJ-MOS transistor 100a and that in the SJ-MOS transistor 100b indicated by broken lines.

As is apparent from the foregoing, the PN column layer 11 of the SJ-MOS transistor 100 in FIGS. 1A and 1B has a structure comprised of two column layers, the first column layer 11a and the second column layer 11b, in which the balance of impurity amount is broken down beforehand. Therefore, it is possible to cancel any surplus of impurity amount caused by variation in shape processing or variation in impurity concentration (hereafter, collectively referred to as variation in formation). As a result, it is possible to ensure a required breakdown voltage of 600V over the winder range of variation in formation than in the conventional SJ-MOS transistor 90 illustrated in FIGS. 22A and 22B.

Description will be given to the relation between each structural parameter related to the PN column layer 11 of the SJ-MOS transistor 100 and the dependence of breakdown voltage on the balance of impurity amount.

Figure 6:
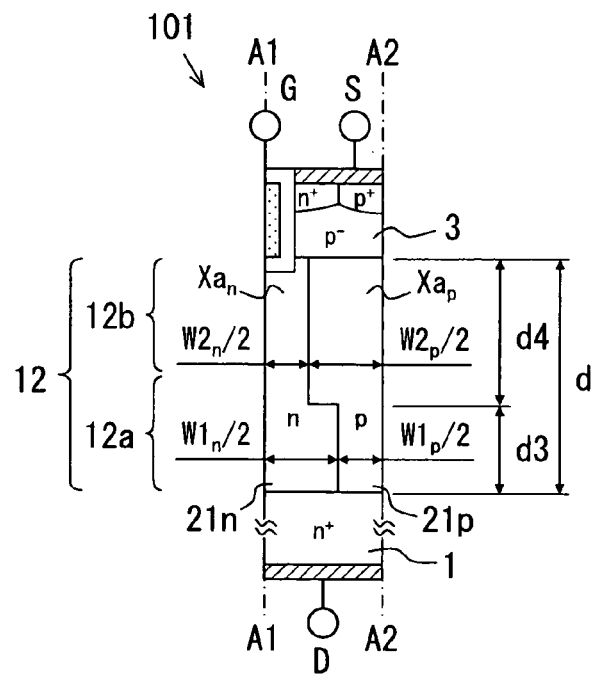
FIG. 6 is a drawing schematically illustrating the repetitive unit structure of SJ-MOS transistor as a modification to the Si-MOS transistor illustrated in FIGS. 1A and 1B.
Figure 7A:
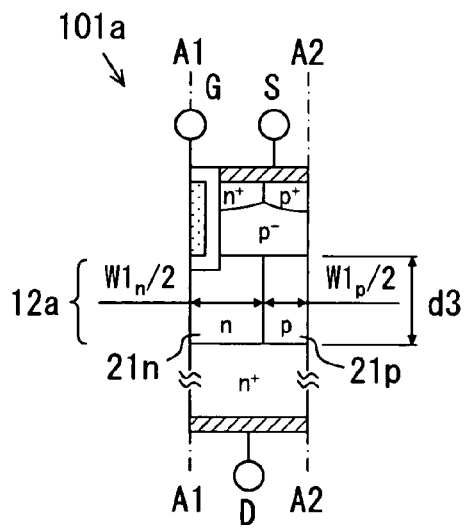
FIG. 7A is a drawing schematically illustrating the repetitive unit structure of SJ-MOS transistor obtained by constructing the first column layer of the SJ-MOS transistor in FIG. 6 as a PN column layer.
Figure 7B:
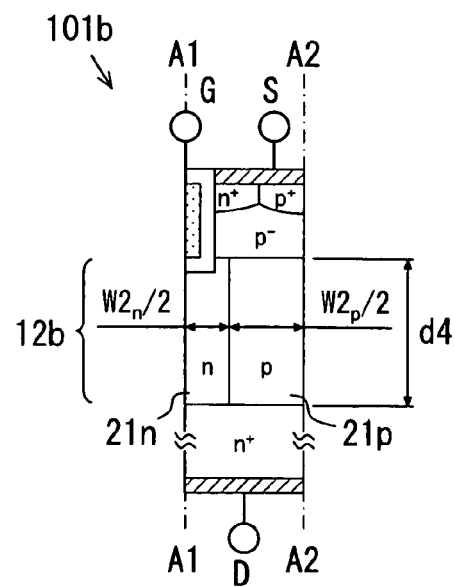
FIG. 7B is a drawing schematically illustrating the repetitive unit structure of SJ-MOS transistor obtained by constructing the second column layer of the SJ-MOS transistor in FIG. 6 as a PN column layer.

FIG. 6 schematically illustrates the repetitive unit structure of SJ-MOS transistor 101 as a modification to the SJ-MOS transistor 100 illustrated in FIGS. 1A and 1B. FIGS. 7A and 7B schematically illustrate the repetitive unit structure of SJ-MOS transistors 101a, 101b obtained by respectively constructing the first column layer 12a and the second column layer 12b in the SJ-MOS transistor 101 in FIG. 6 as a PN column layer.

The SJ-MOS transistor 101 illustrated in FIG. 6 is different from the SJ-MOS transistor 100 in FIGS. 1A and 1B only in the thicknesses d3, d4 of the first column layer 12a and the second column layer 12b. The SJ-MOS transistor 101 and the SJ-MOS transistor 100 are identical with each other in the other structural parameters. In the SJ-MOS transistor 100 in FIGS. 1A and 1B, the thickness d1 of the first column layer 11a and the thickness d2 of the second column layer 11b are so set that they are equal to each other (d1=d2=d/2). In the SJ-MOS transistor 101 in FIG. 6, meanwhile, the thickness d3 of the first column layer 12a and the thickness d4 of the second column layer 12b are so set that the former is smaller than the latter (d3<d4). The following relation holds in the respective column layers as indicated by the mathematical expressions in FIG. 6: $Da \propto (Xa_n \cdot W1_n - Xa_p \cdot W1_p) > 0$ in the first column layer 12a and $Db \propto (Xa_n \cdot W2_n - Xa_p \cdot W2_p) < 0$ in the second column layer 12b. Here, $Xa_p = Xa_n$, and $|W1_n - W1_p| = |W2_n - W2_p|$.

Figure 8:
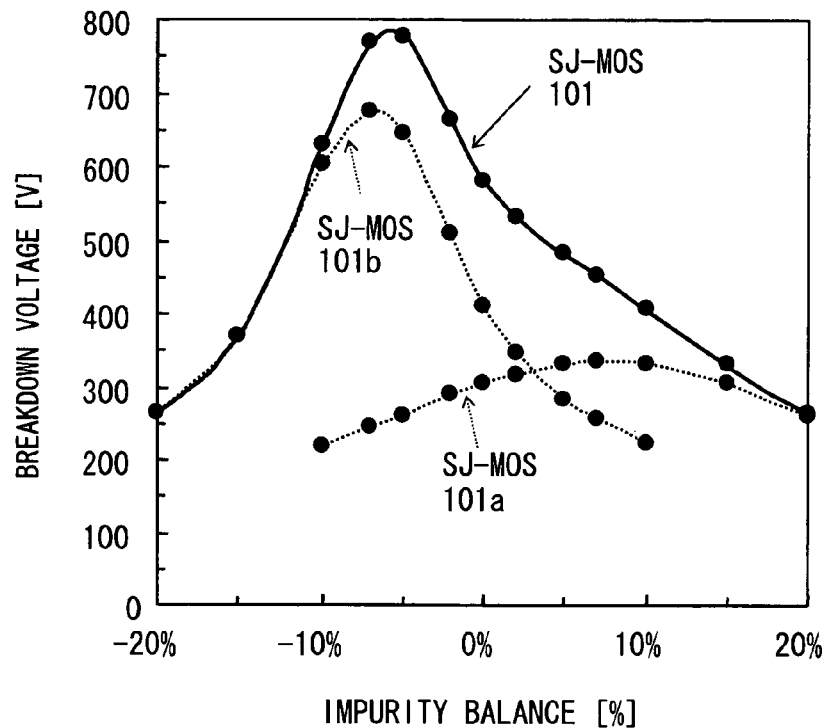
FIG. 8 is a drawing illustrating the result of simulation on the SJ-MOS transistors illustrated in FIG. 6 and FIGS. 7A and 7B and illustrates the dependence of breakdown voltage on the balance of impurity concentration by comparison.

FIG. 8 illustrates the result of simulation on the SJ-MOS transistors 101, 101a, 101b illustrated in FIG. 6 and FIGS. 7A and 7B and compares them for the dependence of breakdown voltage on the balance of impurity concentration.

Since the thickness d3 of the first column layer 12a is small, the following takes place with respect to the breakdown voltage of the SJ-MOS transistor 101a illustrated in FIG. 7A: the breakdown voltage is lower as a whole with the position where the balance of impurity concentration is 7% in the center as compared with the characteristic of the SJ-MOS transistor 100a illustrated in FIG. 5. Meanwhile, since the thickness d4 of the first column layer 12a is large, the following takes place with respect to the breakdown voltage of the SJ-MOS transistor 101b illustrated in FIG. 7B: the breakdown voltage is higher as a whole with the position where the balance of impurity concentration is −7% in the center as compared with the characteristic of the SJ-MOS transistor 100b illustrated in FIG. 5. The SJ-MOS transistor 101 has the PN column layer 12 constructed of the first column layer 12a of the SJ-MOS transistor 101a and the second column layer 12b of the SJ-MOS transistor 101b. For the above-mentioned reason, the following takes place with respect to the dependence of breakdown voltage on the balance of impurity concentration of the SJ-MOS transistor 101: the characteristic of (the SJ-MOS transistor 100b having) the first column layer 12a thick as illustrated in FIGS. 7A and 7B becomes prominent. As mentioned above, the thickness d1, d3 of the first column layer 11a, 12a and the thickness d2, d4 of the second column layer 11b, 12b have influence on the peak height of maximum breakdown voltage with respect to the dependence of breakdown voltage on the balance of impurity amount.

As is apparent from the comparison of the characteristics related to the SJ-MOS transistor 100 in FIG. 5 with the characteristic of the SJ-MOS transistor 101 in FIG. 6, the following takes place with respect to ranges within which breakdown voltage can be ensured: the range within which a breakdown voltage of 600V can be ensured in the SJ-MOS transistor 101 is narrower than the range within which a breakdown voltage of 600V can be ensured in the SJ-MOS transistor 100. Therefore, it is desirable that the thicknesses of the first column layer and the second column layer should be equally set as in the SJ-MOS transistor 100 in FIGS. 1A and 1B. As a result, the maximum value of breakdown voltage related to the first column layer and the maximum value of breakdown voltage related to the second column layer becomes equal to each other. This makes it easier to design the breakdown voltage of a PN column layer comprised of a first column layer and a second column layer and a stable percentage of non-defectives can be obtained in manufacture. Especially, when the following measure as in the SJ-MOS transistor 100 in FIGS. 1A and 1B is taken, the structure of the PN column layer is simplified: the thicknesses of the first column layer and the second column layer are set to ½ of the thickness of the PN column layer and the PN column layer is divided into two, the first column layer and the second column layer. As a result, the above designing of breakdown voltage is also simplified and facilitated.

Figure 9:
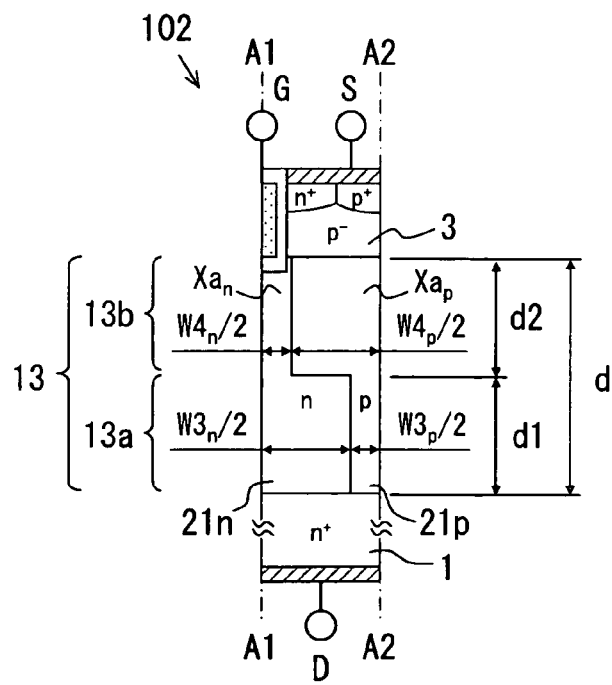
FIG. 9 is a drawing schematically illustrating the repetitive unit structure of SJ-MOS transistor as another modification to the SJ-MOS transistor illustrated in FIGS. 1A and 1B.
Figure 10A:
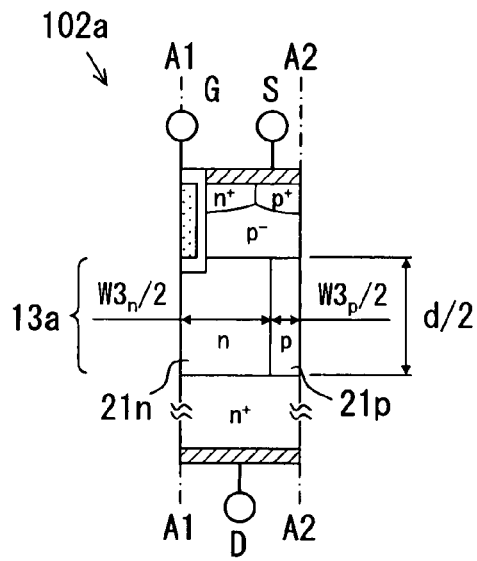
FIG. 10A is a drawing schematically illustrating the repetitive unit structure of SJ-MOS transistor obtained by constructing the first column layer of the SJ-MOS transistor in FIG. 9 as a PN column layer.
Figure 10B:
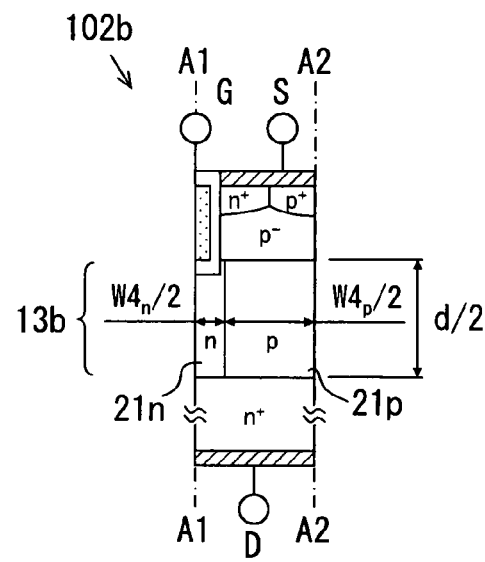
FIG. 10B is a drawing schematically illustrating the repetitive unit structure of SJ-MOS transistor obtained by constructing the second column layer of the SJ-MOS transistor in FIG. 9 as a PN column layer.

FIG. 9 schematically illustrates the repetitive unit structure of SJ-MOS transistor 102 as another modification to the SJ-MOS transistor 100 illustrated in FIGS. 1A and 1B. FIGS. 10A and 10B schematically illustrate the repetitive unit structure of SJ-MOS transistors 102a, 102b obtained by respectively constructing the first column layer 13a and the second column layer 13b in the SJ-MOS transistor 102 in FIG. 9 as a PN column layer.

The SJ-MOS transistor 102 illustrated in FIG. 9 is different from the SJ-MOS transistor 100 in FIGS. 1A and 1B only in the thicknesses $W3_n$, $W3_p$ and $W4_n$, $W4_p$ of the first column layer 13a and the second column layer 13b. The SJ-MOS transistor 102 and the SJ-MOS transistor 100 are identical with each other in the other structural parameters. In the SJ-MOS transistor 102 in FIG. 9, the width $W3_n$ of the N-type columns 21n in the first column layer 13a is set wider than that in the SJ-MOS transistor 100 ($W3_n > W1_n$); and the width $W4_n$ of the N-type columns 21n in the second column layer 13b is set narrower than that in the SJ-MOS transistor 100 ($W4_n < W2_n$). The SJ-MOS transistor 102 in FIG. 9 is also so set that the relation of $|W3_n - W3_p| = |W4_n - W4_p|$ holds. The following relation holds in the respective column layers as indicated by the mathematical expressions in FIG. 9: $Dc \propto (Xa_n \cdot W1_n - Xa_p \cdot W1_p) > 0$ in the first column layer 13a and $Db \propto (Xa_n \cdot W2_n - Xa_p \cdot W2_p) < 0$ in the second column layer 13b. Here, $Xa_p = Xa_n$, and $d1 = d2 = d/2$.

Figure 11:
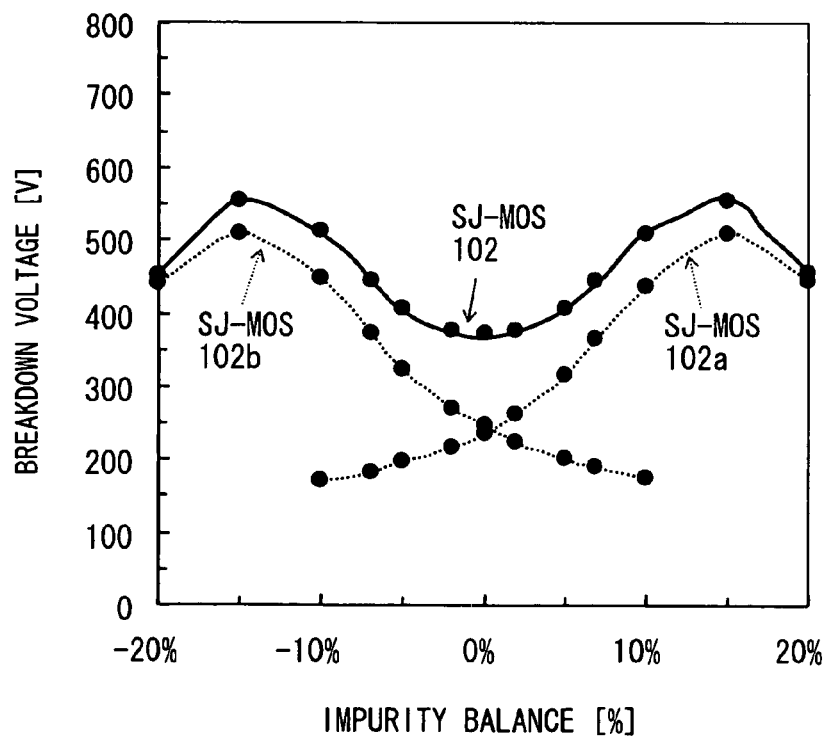
FIG. 11 is a-drawing illustrating the result of simulation on the SJ-MOS transistors illustrated in FIG. 9 and FIGS. 10A and 10B and illustrates the dependence of breakdown voltage on the balance of impurity concentration by comparison.

FIG. 11 illustrates the result of simulation on the SJ-MOS transistors 102, 102a, 102b illustrated in FIG. 9 and FIGS. 10A and 10B and compares them for the dependence of breakdown voltage on the balance of impurity concentration.

As illustrated in FIG. 11, the breakdown voltage of the SJ-MOS transistor 102a in FIG. 10A takes the maximum value when the balance of impurity concentration is approximately 15%. The reason for this is as follows: the width $W3_n$ of the N-type columns 21n in the first column layer 13a of the SJ-MOS transistor 102 is set wider than that of the SJ-MOS transistor 100a in FIG. 4A ($W3_n > W1_n$); therefore, the breakdown voltage is shifted to the positive side from the balance of impurity concentration at which the condition of "the impurity amounts (=concentration×volume) of the N-type columns 21n and the P-type column 21p shall be made equal to each other" is met. Similarly, the breakdown voltage of the SJ-MOS transistor 102b in FIG. 10B is shifted to the negative side and takes the maximum value when the balance of impurity concentration is approximately −15%. Thus the peak position of maximum breakdown voltage can be varied by taking the following measure with respect to the dependence of breakdown voltage on the balance of impurity amount: the width $W1_n$ to $W4_n$ of the N-type columns 21n and the width $W1p$ to $W4_p$ of the P-type columns 21p in the first column layer 11a, 13a and the second column layer 11b, 13b are varied.

As is apparent from FIG. 5 and FIG. 11, it is desirable that the following measure should be taken in the above-mentioned SJ-MOS transistors: the difference in impurity amount of the first column layer and the difference in impurity amount of the second column layer are so set that their absolute values are equal to each other. In these SJ-MOS transistors, the value of the difference in impurity amount of the first column layer and the value of the difference in impurity amount of the second column layer are symmetric with respect to zero. According to the result of simulation on these semiconductor devices, the following values are also symmetric with respect to zero in graphs indicating the relation between the value of impurity amount and breakdown voltage: the value of difference in impurity amount at which breakdown voltage is maximized in a first graph related to the first column layer (the first graph is symmetric with respect to this value); and the value of difference in impurity amount at which breakdown voltage is maximized in a second graph related to the second column layer (the second graph is symmetric with respect to this value). In the examples of the SJ-MOS transistors 100, 102 illustrated in FIG. 5 and FIG. 11, the following values are respectively symmetric with respect to zero: the value Da of difference in impurity amount of the first column layer 11a and the value Db of difference in impurity amount of the second column layer 11b; and the value Dc of difference in impurity amount of the first column layer 13a and the value Dd of difference in impurity amount of the second column layer 13b. For this reason, the following graphs are also respectively symmetric with respect to zero: the graph of the SJ-MOS transistor 100a and the graph of the SJ-MOS transistor 100b; and the graph of the SJ-MOS transistor 102a and the graph of the SJ-MOS transistor 102b. As a result, the following can be implemented in designing the breakdown voltage of a PN column layer comprised of a first column layer and a second column layer: it is possible to easily design the value of difference in impurity amount at which sufficient breakdown voltage can be ensured even when the above-mentioned variation in formation is produced; and a stable percentage of non-defectives can be obtained in manufacture.

When the absolute values of the difference in impurity amount of the first column layer and the difference in impurity amount of the second column layer are too large, the phenomenon illustrated in FIG. 11 occurs. That is, the SJ-MOS transistor 102 has the PN column layer 13 constructed of the first column layer 13a of the SJ-MOS transistor 102a and the second column layer 13b of the SJ-MOS transistor 102b. In the SJ-MOS transistor 102, the dependence of breakdown voltage on the balance of impurity concentration is locally lowered in a position where the balance of impurity concentration is 0%. Description will be given to a structure for compensating this reduction in a position where the balance of impurity concentration is 0%.

Figure 12:
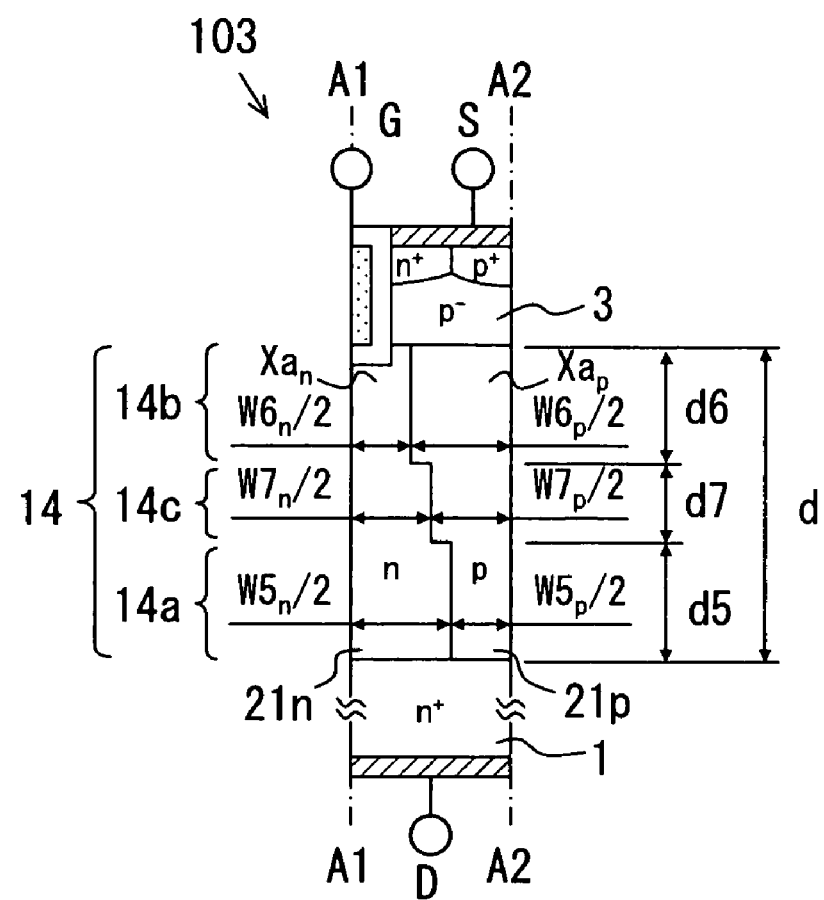
FIG. 12 is a drawing schematically illustrating the repetitive unit structure of SJ-MOS transistor as another modification to the SJ-MOS transistor illustrated in FIGS. 1A and 1B.
Figure 13A:
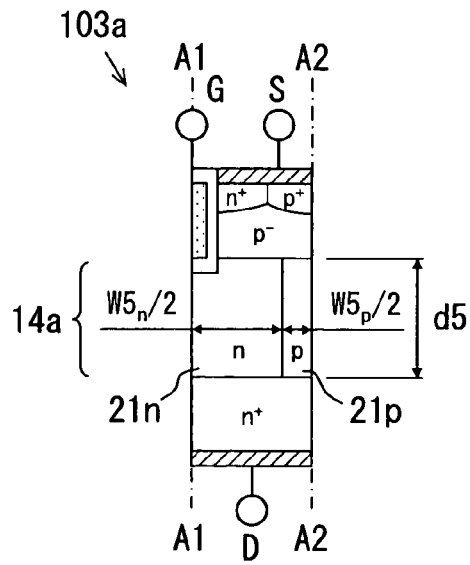
FIG. 13A is a drawing schematically illustrating the repetitive unit structure of SJ-MOS transistor obtained by constructing the first column layer of the SJ-MOS transistor in FIG. 12 as a PN column layer.
Figure 13B:
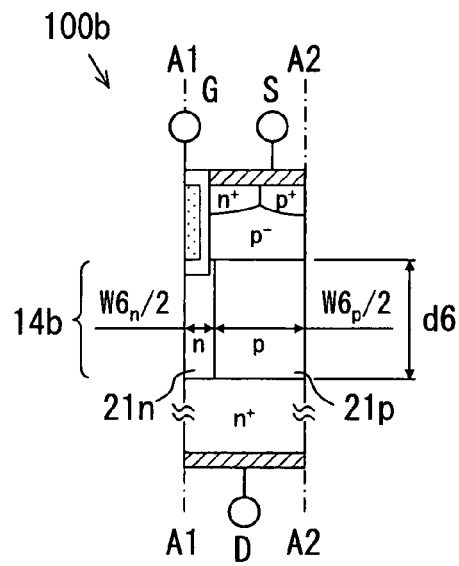
FIG. 13B is a drawing schematically illustrating the repetitive unit structure of SJ-MOS transistor obtained by constructing the second column layer of the SJ-MOS transistor in FIG. 12 as a PN column layer.
Figure 13C:
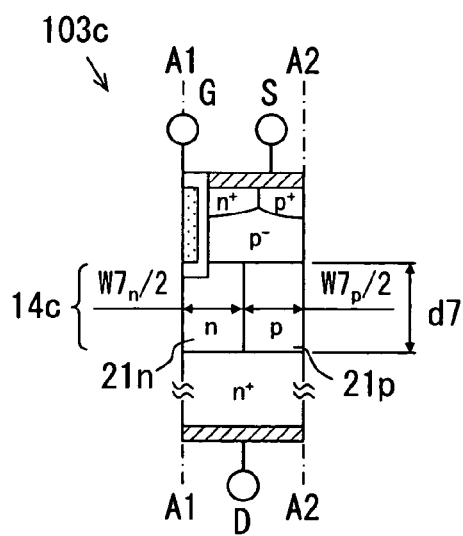
FIG. 13C is a drawing schematically illustrating the repetitive unit structure of SJ-MOS transistor obtained by constructing the third column layer of the SJ-MOS transistor in FIG. 12 as a PN column layer.

FIG. 12 schematically illustrates the repetitive unit structure of SJ-MOS transistor 103 as another modification to the SJ-MOS transistor 100 illustrated in FIGS. 1A and 1B. The drawings from FIG. 13A to FIG. 13C schematically illustrate the repetitive unit structure of SJ-MOS transistors 103a to 103c. The SJ-MOS transistors 103a to 103c are obtained by respectively constructing the first column layer 14a, second column layer 14b, and third column layer 14c in the SJ-MOS transistor 103 in FIG. 12 as a PN column layer.

In the SJ-MOS transistor 100 in FIGS. 1A and 1B, the PN column layer 11 is constructed of the first column layer 11a abutted against the N-type semiconductor layer 1 and the second column layer 11b abutted against the P-type semiconductor layer 3. In the SJ-MOS transistor 103 in FIG. 12, meanwhile, the PN column layer 14 is provided with the third column layer 14c positioned in the center in addition to the following layers: the first column layer 14a abutted against the N-type semiconductor layer 1 and the second column layer 14b abutted against the P-type semiconductor layer 3. The value Dg of the above-mentioned difference in impurity amount of the third column layer 14c at an arbitrary depth is set between the following values: the value De of difference in impurity amount in the first column layer 14a and the value Df of difference in impurity amount in the second column layer 14b (Df<Dg<De). As a more concrete example, the following measure will be taken: the value De of difference in impurity amount in the first column layer 14a and the value Df of difference in impurity amount in the second column layer 14b are so set that their absolute values are equal to each other; and the value Dg of difference in impurity amount of the third column layer 14c is set to zero. The following relation holds in the respective column layers as indicated by the mathematical expressions in FIG. 12: $De \propto (Xa_n \cdot W5_n - Xa_p \cdot W5_p) > 0$ in the first column layer 14a, $Df \propto (Xa_n \cdot W6_n - Xa_p \cdot W6_p) < 0$ in the second column layer 14b and $Df < Dg \propto (Xa_n \cdot W7_n - Xa_p \cdot W7_p) < De$ in the third column layer 14c. Here, $Xa_p = Xa_n$, $|W5_n - W5_p| = |W6_n - W6_p|$, and $Dg = 0$.

Figure 14:
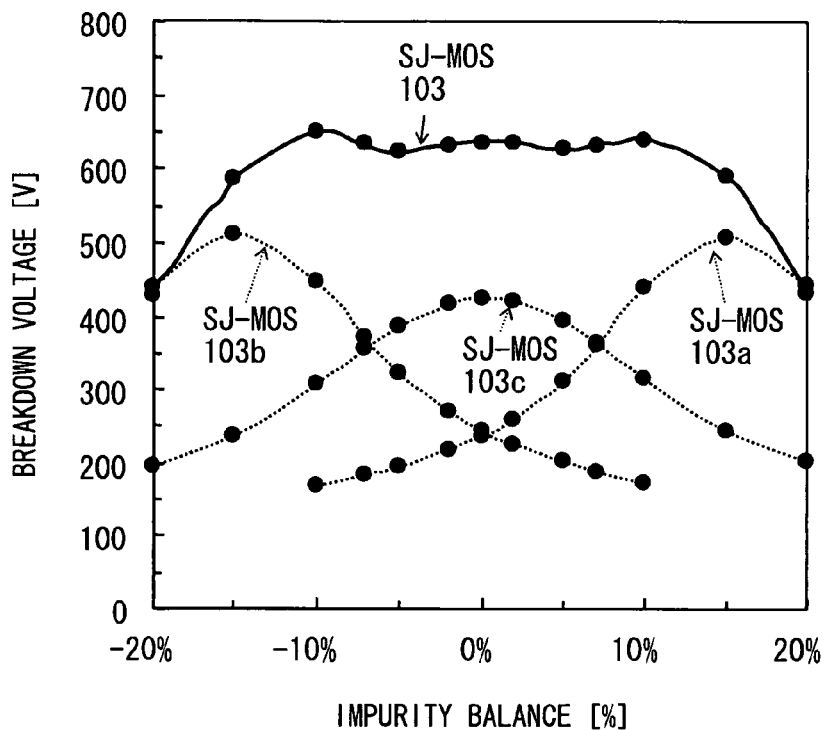
FIG. 14 is a drawing illustrating the result of simulation on the SJ-MOS transistors and illustrates the dependence of breakdown voltage on the balance of impurity concentration by comparison.

FIG. 14 illustrates the result of simulation on the SJ-MOS transistors 103, 103a to 103c in the above concrete example and compares them for the dependence of breakdown voltage on the balance of impurity concentration.

As illustrated in FIG. 14, the following takes place with respect to the breakdown voltage of the SJ-MOS transistor 103 as the result of the insertion of the SJ-MOS transistor 103c in between the SJ-MOS transistor 103a and the SJ-MOS transistor 103b: the characteristic of the SJ-MOS transistor 103c with the balance of impurity concentration of 0% in the center is added also with respect to the dependence of breakdown voltage on the balance of impurity concentration. In the breakdown voltage characteristic of the SJ-MOS transistor 102 in FIG. 11, the local reduction in breakdown voltage in a position where the balance of impurity concentration is 0% occurs. As the result of the above insertion, in the breakdown voltage characteristic of the SJ-MOS transistor 103 illustrated in FIG. 14, this local reduction in breakdown voltage does not occur. Thus a required breakdown voltage of 600V can be ensured over such a wide range of the balance of impurity concentration as −15% to 15%.

As mentioned above, the insertion of the third column layer 14c makes it possible to implement the following in designing the breakdown voltage of the PN column layer 14: it is possible to easily design a more accurate value of difference in impurity amount at which sufficient breakdown voltage can be ensured when the above variation in formation is produced. A more stable percentage of non-defectives can be obtained in manufacture.

It is desirable that the thickness d7 of the third column layer 14c of the SJ-MOS transistor 103 illustrated in FIG. 12 should be set smaller than both the thickness d5 of the first column layer 14a and the thickness d6 of the second column layer 14b. The third column layer 14c makes it possible to finely adjust the designed breakdown voltage of the above PN column layer 14 comprised of the first column layer 14a and the second column layer 14b. The third column layer inserted in between the first column layer 14a and the second column layer 14b need not be such a single layer as the third column layer 14c in the SJ-MOS transistor 103 and may be constructed of multiple divided layers different in width or thickness.

As the PN column layer is divided more finely, the characteristic of the SJ-MOS transistor approaches that of SJ-MOS transistors with the PN column layer constructed in taper structure as in Patent Document 1. Therefore, when the PN column layer is divided too finely, the range of difference in impurity amount within which a required breakdown voltage can be ensured becomes narrower than that in the SJ-MOS transistor 100 in FIGS. 1A and 1B as illustrated in FIG. 3. The reason for this is as follows: in SJ-MOS transistors whose PN column layer is of taper structure, variation in breakdown voltage is reduced by making gentler the gradient of characteristic values with the balance of impurity amount of 0% in the center; in the SJ-MOS transistor 100 in FIGS. 1A and 1B, meanwhile, variation in breakdown voltage is reduced by forming two breakdown voltage peaks, one by the first column layer 11a and one by the second column layer 11b. As a result, the SJ-MOS transistor makes it possible to obtain a required breakdown voltage over a wider range of the balance of impurity amount than in SJ-MOS transistors whose PN column layer is of taper structure. This makes the SJ-MOS transistor an element in which the breakdown voltage does not vary so much even though there is manufacture variation with respect to impurity concentration and which is advantageous for the enhancement of percentage of non-defectives.

Figure 15A:
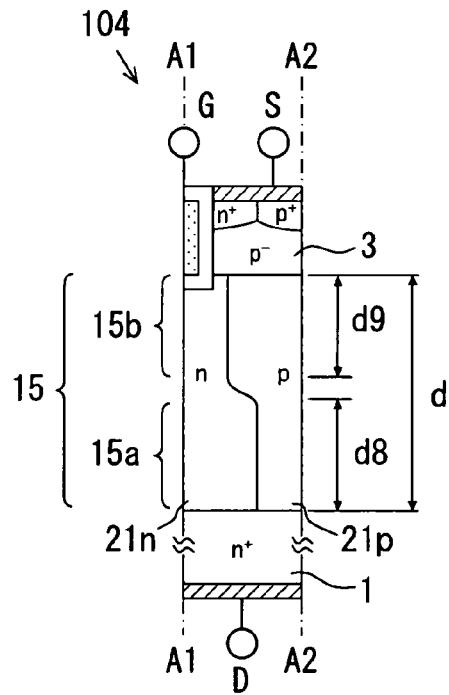
FIG. 15A is a drawing schematically illustrating the repetitive unit structure of SJ-MOS transistor as a modification to the SJ-MOS transistor illustrated in FIGS. 1A and 1B.
Figure 15B:
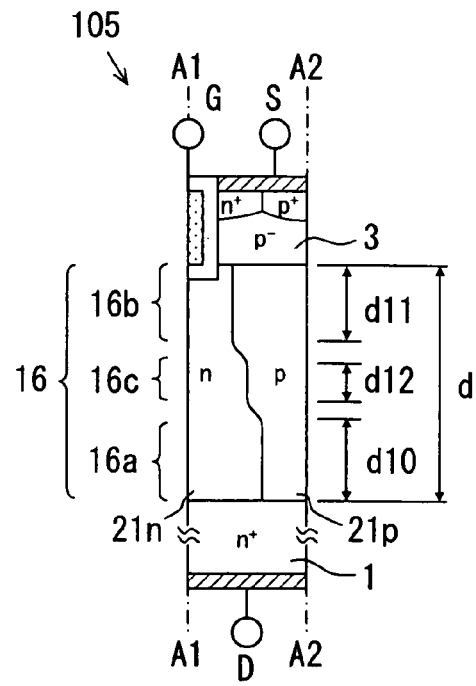
FIG. 15B is a drawing schematically illustrating the repetitive unit structure of SJ-MOS transistor as a modification to the SJ-MOS transistor illustrated in FIG. 12.

FIG. 15A schematically illustrates the repetitive unit structure of SJ-MOS transistor 104 as a modification to the SJ-MOS transistor 100 illustrated in FIGS. 1A and 1B. FIG. 15B schematically illustrates the repetitive unit structure of SJ-MOS transistor 105 as a modification to the SJ-MOS transistor 103 illustrated in FIG. 12.

In the SJ-MOS transistor 100 in FIGS. 1A and 1B, the PN column layer 11 is comprised of the first column layer 11a abutted against the N-type semiconductor layer 1 and the second column layer 11b abutted against the P-type semiconductor layer 3; and the PN column layer 11 is divided into two, the first column layer 11a and the second column layer 11b. In the PN column layer 15 of the SJ-MOS transistor 104 illustrated in FIG. 15A, meanwhile, there is an intermediate layer between the first column layer 15a abutted against the N-type semiconductor layer 1 and the second column layer 15b abutted against the P-type semiconductor layer 3. In the intermediate layer, the width of the N-type columns 21n and that of the P-type columns 21p are continuously changed. Similarly, in the SJ-MOS transistor 103 in FIG. 12, the PN column layer 11 is divided into three, the first column layer 14a, third column layer 14c, and second column layer 14b. In the PN column layer 15 of the SJ-MOS transistor 105 illustrated in FIG. 15B, meanwhile, there is the intermediate layer between the first column layer 16a, third column layer 16c, and second column layer 16b. In the intermediate layers, the width of the N-type columns 21n and that of the P-type columns 21p are continuously changed.

The first column layers 11a to 14a, second column layers 11b to 14b, and third column layer 14c in the SJ-MOS transistors 100 to 103 bring about the effect of reduction in variation in breakdown voltage due to variation in shape processing or variation in impurity concentration. This effect can also be brought about in the SJ-MOS transistors 104, 105 in FIGS. 15A and 15B having an intermediate layer, needless to add.

As mentioned above, SJ-MOS transistor 100 to 105 having the desired dependence of breakdown voltage on the balance of impurity amount can be designed in detail by appropriately setting each of the above-mentioned structural parameters of the following layers: the first column layer 11a to 16a, second column layer 11b to 16b, and third column layer 14c, 16c of the SJ-MOS transistor.

Brief description will be given to a manufacturing method for the SJ-MOS transistor 100 in FIGS. 1A and 1B.

The drawings from FIGS. 16A to 16D and FIGS. 17A to 17C illustrate an example of the manufacturing method for the SJ-MOS transistor 100 and they are sectional views illustrating a step of the manufacturing process for the PN column layer 11 as a substantial part.

Figure 16A:
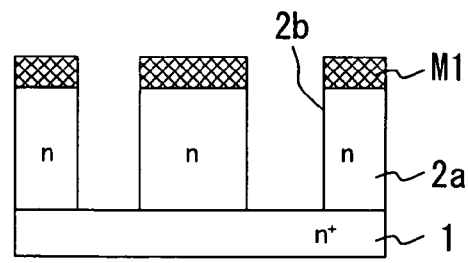
FIGS. 16A to 16D are sectional views illustrating an example of the manufacturing method for the SJ-MOS transistor and illustrates a step of the manufacturing process for the PN column layer as a substantial part.
Figure 16B:
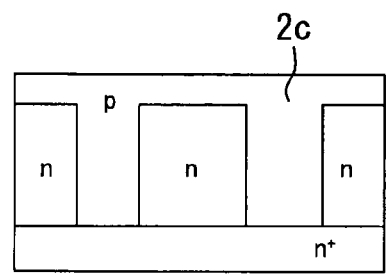
Figure 16C:
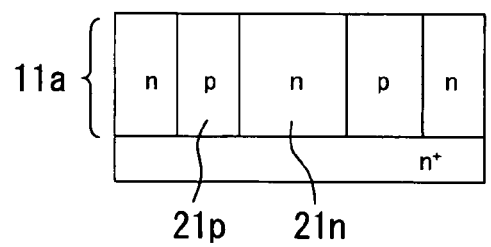

First, an N-type (n) layer 2a to be the N-type columns 21n is epitaxially grown over the entire surface of a silicon substrate 1 to be the N-type (n$^+$) semiconductor layer 1 of the SJ-MOS transistor 100. As illustrated in FIG. 16A, a trench formation mask M1 having a predetermined opening is formed over the N-type layer 2a by photolithography. Using this trench formation mask M1 as a mask, reactive ion etching (RIE) is carried out to form trenches 2b for forming the P-type columns 21p. The trench formation mask M1 is stripped and then a P-type (p) layer 2c is formed by epitaxial growth to fill the trenches 2b as illustrated in FIG. 16B. Using chemical mechanical polishing (CMP), the P-type layer 2c formed outside the trenches 2b is removed to planarize the work piece as illustrated in FIG. 16C. Thus the first column layer 11a of the SJ-MOS transistor 100 is formed.

Figure 16D:
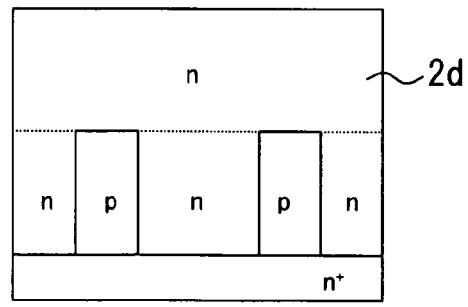
Figure 17A:
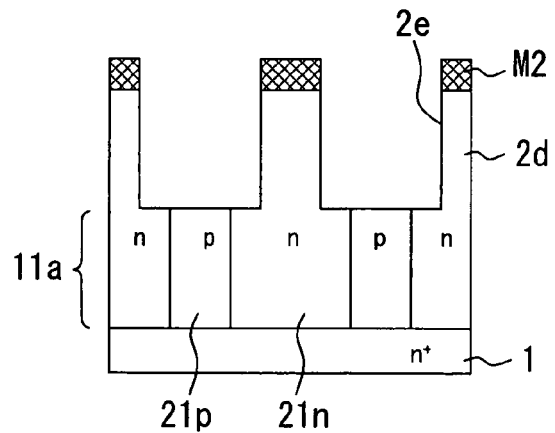
FIGS. 17A to 17C are sectional views illustrating an example of the manufacturing method for the SJ-MOS transistor and illustrates a step of the manufacturing process for the PN column layer as a substantial part.
Figure 17B:
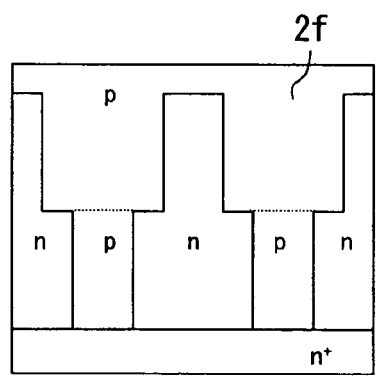
Figure 17C:
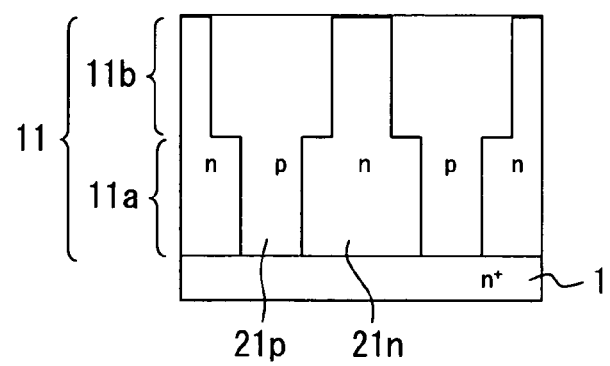

As illustrated in FIG. 16D, subsequently, an N-type (n) layer 2d to be the N-type columns 21n is epitaxially grown over the entire surface of the first column layer 11a with the same impurity concentration as that of the N-type layer 2a in FIG. 16A. As illustrated in FIG. 17A, a trench formation mask M2 having a predetermined opening is formed over the N-type layer 2d by photolithography. Using the trench formation mask M2 as a mask, reactive ion etching (RIE) is carried out to form trenches 2e for forming the P-type columns 21p. The trench formation mask M2 is stripped and then a P-type (p) layer 2f is formed by epitaxial growth with the same impurity concentration as that of the P-type layer 2c in FIG. 16B to fill the trenches 2e as illustrated in FIG. 17B. Using chemical mechanical polishing (CMP), the P-type layer 2f formed outside the trenches 2e is removed to planarize the work piece as illustrated in FIG. 17C. Thus the second column layer 11b is formed and the PN column layer 11 of the SJ-MOS transistor 100 is completed.

Finally, a publicly known MOSFET manufacturing process is carried out to finish the SJ-MOS transistor 100 in FIGS. 1A and 1B.

Figure 18A:
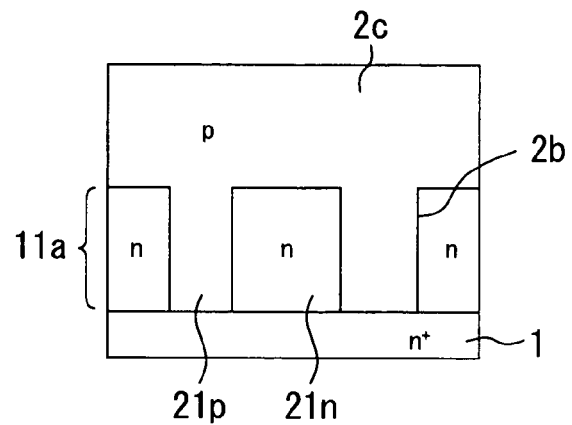
FIGS. 18A to 18C are sectional views illustrating a step of another manufacturing method for the PN column layer as a substantial part of the SJ-MOS transistor.
Figure 18B:
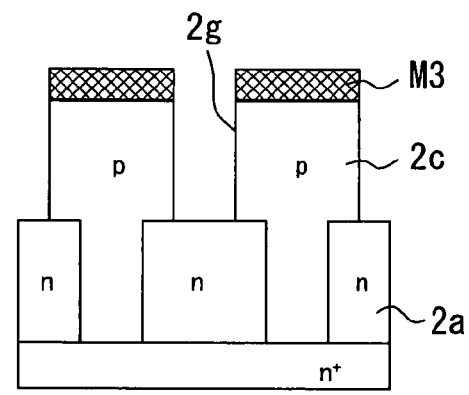
Figure 18C:
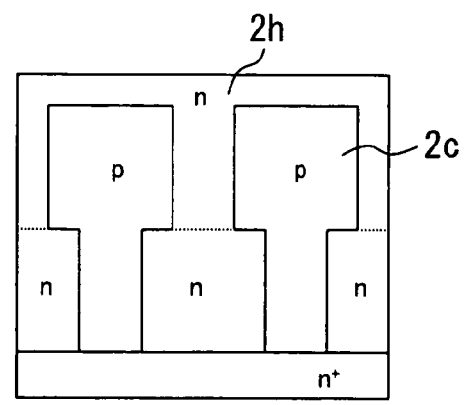

The drawings from FIGS. 18A to 18C are other sectional views illustrating a step of the manufacturing process for the PN column layer 11 as a substantial part of the SJ-MOS transistor 100.

The manufacturing method in FIGS. 18A to 18C is started at the step illustrated in FIG. 16A. After the trench formation mask M1 is stripped, the P-type layer 2c is formed thick by epitaxial growth to fill the trenches 2b as illustrated in FIG. 18A. Thus the first column layer 11a of the SJ-MOS transistor 100 is formed and at the same time the P-type layer 2c is left also over the N-type layer 2a. As illustrated in FIG. 18B, a trench formation mask M3 having a predetermined opening is formed over the P-type layer 2c by photolithography. Using the trench formation mask M3 as a mask, reactive ion etching (RIE) is carried out to form trenches 2g extended to the N-type layer 2a. The trench formation mask M3 is stripped and then an N-type (n) layer 2h is formed by epitaxial growth with the same impurity concentration as that of the N-type layer 2a to fill the trenches 2g as illustrated in FIG. 18C. Using chemical mechanical polishing (CMP), the N-type layer 2h formed outside the trenches 2g is removed to planarize the work piece. This completes the PN column layer 11 of the SJ-MOS transistor 100 illustrated in FIG. 17C.

According to the manufacturing method illustrated in FIGS. 18A to 18C, one chemical mechanical polishing (CMP) step and one epitaxial growth step which are required in the manufacturing method illustrated in FIGS. 16A to 16D and FIGS. 17A to 17C can be omitted.

As described up to this point, the following measure is taken in the SJ-MOS transistors 100 to 105 in this embodiment, illustrated in FIGS. 1A to 15B: the impurity concentrations of the P-type columns 21p and the N-type columns 21n are set to a certain value; and the differences in difference in impurity amount between the first column layer, second column layer, and third column layer are set by the following difference: the difference in width between the columns of the first conductivity type and the columns of the second conductivity type in each column layer. Thus, as described in relation to the manufacturing method in FIGS. 16A to 18C, the impurity concentration can be invariably set when the N-type columns 21n and the P-type columns 21p are formed and thus stable film formation can be carried out.

Second Embodiment

In the SJ-MOS transistors in the first embodiment, the impurity concentrations of the N-type columns 21n and the P-type columns 21p are respectively set to a certain value; and the above-mentioned difference D in impurity amount is set by the widths of the N-type columns 21n and the P-type column 21p. In SJ-MOS transistors in the second embodiment, the widths of the N-type columns and the P-type columns are respectively set to a certain value; and the difference D in impurity amount is set by the impurity concentrations of the N-type columns and the P-type columns.

Figure 19:
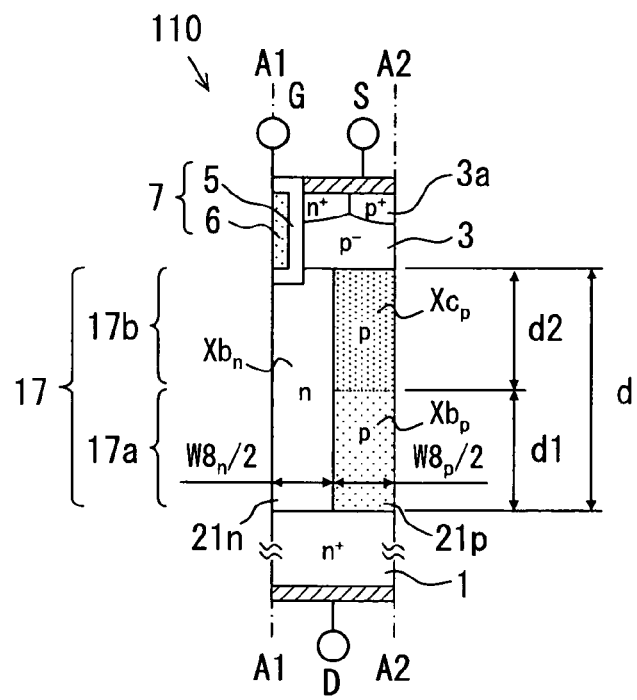
FIG. 19 is a sectional view schematically illustrating the repetitive unit structure of SJ-MOS transistor as an example of a second embodiment corresponding to the SJ-MOS transistor in FIGS. 1A and 1B.

FIG. 19 is a sectional view schematically illustrating the repetitive unit structure of SJ-MOS transistor 110 as an example of this embodiment corresponding to the SJ-MOS transistor 100 in FIGS. 1A and 1B.

In the PN column layer 11 of the SJ-MOS transistor 100 illustrated in FIGS. 1A and 1B, the impurity concentrations of the P-type columns 21p and the N-type column 21n are respectively set to a certain value $Xa_p$, $Xa_n$; and the widths of the P-type columns 21p and the N-type columns 21n are set to different values in the first column layer 11a and in the second column layer 11b. In the SJ-MOS transistor 100 in FIGS. 1A and 1B, as a result, the following relations are built up: the difference Da in impurity amount in the first column layer 11a: $Da \propto (Xa_n \cdot W1_n - Xa_p \cdot W1_p) > 0$ and the difference Db in impurity amount in the second column layer 11b $Db \propto (Xa_n \cdot W2_n - Xa_p \cdot W2_p) < 0$.

In the PN column layer 17 of the SJ-MOS transistor 110 illustrated in FIG. 19, meanwhile, the widths of the P-type columns 21p and the N-type columns 21n are respectively set to a certain value $W8_p$, $W8_n$; and the impurity concentration of the P-type columns 21p is set to different values in the first column layer 17a and the second column layer 17b. In the SJ-MOS transistor 110 in FIG. 19, as a result, the following relations are built up: the difference Dh in impurity amount in the first column layer 17a: $Dh \propto (Xb_n \cdot W8_n - Xb_p \cdot W8_p) > 0$ and the difference Di in impurity amount in the second column layer 17b: $Di \propto (Xb_n \cdot W8_n - Xc_p \cdot W8_p) < 0$. Here, $W8_n = W8_p$, $|Xb_n - Xb_{p|=|Xbn} - Xc_p|$, and $d1 = d2 = d/2$.

The result of simulation on the SJ-MOS transistor 100 illustrated in FIG. 2 is defined by the relation between the above differences Da, Db in impurity amount. For this reason, the same characteristic as that of the SJ-MOS transistor 100 illustrated in FIG. 2 can also be obtained in the SJ-MOS transistor 110 in FIG. 19 by taking the following measure: the relation between the above differences Dh, Di in impurity amount is set similarly with the relation between the differences Da, Db in impurity amount in the SJ-MOS transistor 100. More specifically, the widths and thicknesses of the first column layer 17a and the second column layer 17b are so set that the following relations hold: $W8_n = W8_p$ and $d1 = d2 = d/2$.

In addition, the difference ($Xb_n - xb_p$) in impurity concentration in the first column layer 17a and the difference ($Xb_n - Xc_p$) in impurity concentration in the second column layer 17b are so set that their absolute values are equal to each other. ($|W1_n - W1_p| = |W2_n - W2_p|$.) Thus the following is implemented: the values Dh, Di of the above difference D in impurity amount in the first column layer 17a and the second column layer 17b are equal to each other in absolute value and different only in positive/negative sign; and the same relation as that between the differences Da, Db in impurity amount in the SJ-MOS transistor 100 is obtained and thus the same characteristic as that of the SJ-MOS transistor 100 illustrated in FIG. 2 is obtained. Therefore, the following can be implemented not only with respect to the SJ-MOS transistor 100 in FIGS. 1A and 1B but also with respect to the SJ-MOS transistor 110 in FIG. 19: it is possible to make the SJ-MOS transistor an element in which breakdown voltage does not vary so much even though there is manufacture variation with respect to impurity concentration and which is advantageous for the enhancement of percentage of non-defectives, as compared with the following: the conventional SJ-MOS transistor 90 illustrated in FIGS. 22A and 22B and SJ-MOS transistors whose PN column layer is of taper structure like that in Patent Document 1.

Up to this point, description has been given to an example of the SJ-MOS transistor 110 in FIG. 19 in correspondence with the SJ-MOS transistor 100 in FIGS. 1A and 1B in the first embodiment. Similarly, the SJ-MOS transistor in this embodiment in which the following is implemented is also applicable to the other SJ-MOS transistors 101 to 105 in the first embodiment illustrated in FIGS. 6 to 15B: the widths of the N-type columns and the P-type columns are respectively set to a certain value; and the difference D in impurity amount is set by the impurity concentrations of the N-type columns and the P-type columns.

Figure 20:
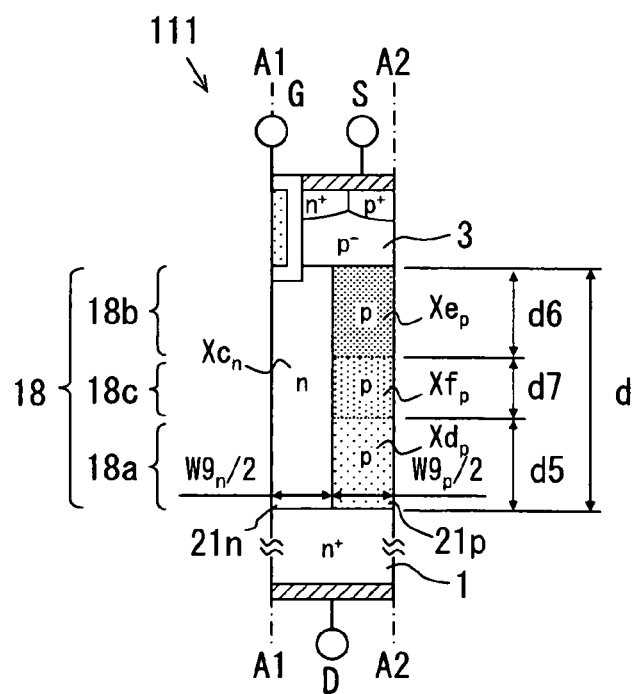
FIG. 20 is a sectional view schematically illustrating the repetitive unit structure of SJ-MOS transistor corresponding to the SJ-MOS transistor in FIG. 12.

FIG. 20 is a sectional view schematically illustrating the repetitive unit structure of SJ-MOS transistor 111 as an example of the other applications, corresponding to the SJ-MOS transistor 103 in FIG. 12.

In the SJ-MOS transistor 111 in FIG. 20, the PN column layer 18 is provided with the third column layer 18c positioned in the center in addition to the following layers: the first column layer 18a abutted against the N-type semiconductor layer 1 and the second column layer 18b abutted against the P-type semiconductor layer 3. The value Dl of difference in impurity amount of the third column layer 18c at an arbitrary depth is set between the following values: the value Dj of difference in impurity amount in the first column layer 18a and the value Dk of difference in impurity amount in the second column layer 18b (Dk<Dl<Dj). As a more concrete example, the following measure will be taken: the Dj of difference in impurity amount in the first column layer 18a and the value Dk of difference in impurity amount in the second column layer 18b are so set that their absolute values are equal to each other; and the value Dl of difference in impurity amount of the third column layer 18c is set to zero. Thus the same characteristic as that of the SJ-MOS transistor 103 illustrated in FIG. 14 can be obtained also with respect to the SJ-MOS transistor 111 in FIG. 20. The following relation holds in the respective column layers as indicated by the mathematical expressions in FIG. 20: $Dj \propto (Xc_n \cdot W9_n - Xd_p \cdot W9_p) > 0$ in the first column layer 18a, $Dk \propto (Xc_n \cdot W9_n - Xe_p \cdot W9_p) < 0$ in the second column layer 18b and $Dk < Dl \propto (Xc_n \cdot W9_n - Xf_p \cdot W9_p) < Dj$ in the third column layer 18c. Here, $W9_n = W9_p$, $|Xc_n - Xd_p| = |Xc_n - Xe_p|$, and $Dg=0$.

Brief description will be given to a manufacturing method for the SJ-MOS transistor 110 in FIG. 19.

Figure 21A:
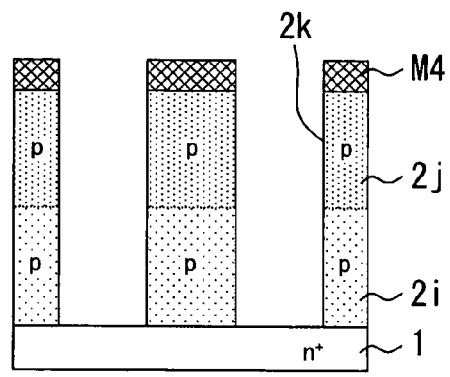
FIGS. 21A to 21C are sectional views illustrating an example of the manufacturing method for the SJ-MOS transistor and illustrates a step of the manufacturing process for a PN column layer as a substantial part.
Figure 21B:
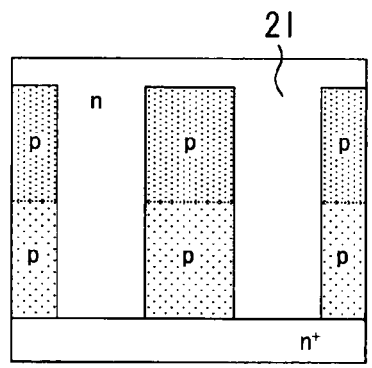
Figure 21C:
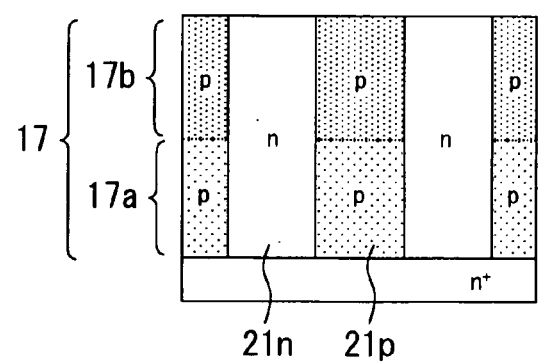

FIGS. 21A to 21C illustrate an example of the manufacturing method for the SJ-MOS transistor 110 and they are sectional views illustrating a step of the manufacturing process for the PN column layer 17 as a substantial part.

First, a P-type (p) layer 2i to be the P-type columns 21p is epitaxially grown over the entire surface of a silicon substrate 1 to be the N-type ($n^+$) semiconductor layer 1 of the SJ-MOS transistor 110 with a predetermined impurity concentration. A P-type (p) layer 2j higher in impurity concentration is epitaxially grown over the P-type layer 2i. As illustrated in FIG. 21A, a trench formation mask M4 having a predetermined opening is formed over the P-type layer 2j by photolithograph. Using this trench formation mask M4 as a mask, reactive ion etching (RIE) is carried out to form trenches 2k for forming the N-type columns 21n. The trench formation mask M4 is stripped and then an N-type (n) layer 21 is formed by epitaxial growth to fill the trenches 2k as illustrated in FIG. 21B. Using chemical mechanical polishing (CMP), the N-type layer 21 formed outside the trenches 2k to planarize the work piece as illustrated in FIG. 21C. Thus the PN column layer 17 of the SJ-MOS transistor 110 illustrated in FIG. 19 is completed.

Finally, a publicly known MOS transistor FET manufacturing process is carried out to finish the SJ-MOS transistor 110 in the FIG. 19.

In the above-mentioned SJ-MOS transistors 110, 111 in this embodiment illustrated in FIGS. 19 and 20 as examples, the P-type columns 21p and the N-type columns 21n are respectively set to a certain width; and the above-mentioned differences in difference in impurity amount between the first column layer, second column layer, and third column layer are set by the difference in impurity concentration between the P-type columns 21p and the N-type columns 21n as a function of depth. Thus the trench formation process used to form the N-type columns or the P-type column can be simplified as described in relation to the manufacturing method in FIGS. 21A to 21C. Therefore, increase in manufacturing cost can be suppressed.

Other Embodiments

In the description of the first embodiment, SJ-MOS transistors in which the following measure is taken have been taken as examples: the impurity concentrations of the N-type columns 21n and the P-type columns 21p are respectively set to a certain value; and the differences D in impurity amount of the first column layer and the second column layer are set by the widths of the N-type columns 21n and the P-type columns 21p. In the description of the second embodiment, SJ-MOS transistors in which the following measure is taken have been taken as examples: the widths of the N-type columns 21n and the P-type columns 21p are respectively set to a certain value; and the differences D in impurity amount of the first column layer and the second column layer are set by the impurity concentrations of the N-type columns and the P-type columns. However, the semiconductor device need not be constructed as in these examples and may be so constructed that the following measure is implemented: both the widths and the impurity concentrations of the N-type columns 21n and the P-type columns 21p are set to different values; and the differences D in impurity amount of the first column layer and the second column layer are set.

Both in the description of the first embodiment and in the description of the second embodiment, n-channel SJ-MOS transistors 100 to 105, 110, 111 have been taken as examples of the semiconductor device. However, the same effect can also be obtained in p-channel SJ-MOS transistors obtained by inverting the conductivity type of each part of the SJ-MOS transistors 100 to 105, 110, 111.

As mentioned above, the semiconductor device is a semiconductor device in which a PN column layer that functions as a super junction is formed. Thus, it is possible to make it a semiconductor device in which variation in breakdown voltage due to variation in shape processing or variation in impurity concentration can be further reduced.

As described in relation to the first embodiment and the second embodiment as examples, the semiconductor device is especially suitable for vertical insulating gate transistor elements in which the following is implemented: a P-type semiconductor layer is used as a channel formation layer and there is provided an insulating gate electrode of trench structure that penetrates the P-type semiconductor layer and is extended to an N-type column of the PN column layer.

The above disclosure has the following aspects.

According to an aspect of the present disclosure, a semiconductor device includes: a first semiconductor layer having a first conductive type; a PN column layer disposed on the first semiconductor layer; and a second semiconductor layer having a second conductive type and disposed on the PN column layer. The PN column includes a first column layer and a second column layer. The first column layer is disposed on the first semiconductor layer, and the second column layer is disposed between the first column layer and the second semiconductor layer. Each of the first column layer and the second column layer includes a first column having the first conductive type and a second column having the second conductive type. The first column and the second column in the first column layer are alternately arranged along with a horizontal direction parallel to a first boundary between the PN column layer and the first semiconductor layer. The first column and the second column in the second column layer are alternately arranged along with the horizontal direction parallel to a second boundary between the PN column layer and the second semiconductor layer. The first column layer has a first impurity amount difference, which is defined at a predetermined depth from the first boundary by subtracting an impurity amount in the second column from an impurity amount in the first column. The second column layer has a second impurity amount difference, which is defined at a predetermined depth from a second boundary between the PN column layer and the second semiconductor layer by subtracting an impurity amount in the second column from an impurity amount in the first column. The first impurity amount difference is constant and positive, and the second impurity amount difference is constant and negative.

In the semiconductor device, the PN column layer that can be caused to function as a super junction is formed. This makes it a semiconductor device in which both the enhancement of breakdown voltage and the reduction of on resistance can be achieved.

In the semiconductor device, the first column layer is so formed that its thickness from the first interface of the PN column layer abutted against the semiconductor layer of the first conductivity type is a predetermined value; and the second column layer is so formed that its thickness from the second interface of the PN column layer abutted against the semiconductor layer of the second conductivity type is a predetermined value. The first column layer is a layer in which the above difference in impurity amount at an arbitrary depth is set to a certain positive value. The second column layer is a layer in which the above difference in impurity amount at an arbitrary depth is set to a certain negative value. In other words, the PN column layer in the above semiconductor device is so structured that it has the following layers: a first column layer that is abutted against the semiconductor layer of the first conductivity type and in which the balance of impurity amount is swung to a certain degree so that it is rich with the impurity of the first conductivity type; and a second column layer that is abutted against the semiconductor layer of the second conductivity type and in which the balance of impurity amount is swung to a certain degree so that it is rich with the impurity of the second conductivity type. The thicknesses and differences in impurity amount of the first column layer and the second column layer in this PN column layer can be appropriately set. In the semiconductor device, any surplus of impurity amount caused by variation in shape processing or variation in impurity concentration (hereafter, collectively referred to as variation in formation) is canceled by taking the following measure: the first column layer and the second column layer are formed in the PN column layer to break down the balance of impurity amount in the direction of depth beforehand. In the above semiconductor device, as a result, variation in breakdown voltage due to the above variation in formation can be reduced more than in the following conventional semiconductor devices: semiconductor devices in which the difference in impurity amount is zeroed in the entire PN column layer in the direction of thickness; and semiconductor devices in which the joint areas between the N-type columns and the P-type columns are provided with a taper structure to zero the difference in impurity amount in some narrow region. Therefore, the above semiconductor device makes it possible to enhance the percentage of non-defectives with respect to breakdown voltage as compared with conventional semiconductor devices.

As mentioned above, the semiconductor device is a semiconductor device in which a PN column layer that functions as a super junction is formed. The foregoing makes it a semiconductor device in which variation in breakdown voltage due to variation in shape processing or variation in impurity concentration can be further reduced.

Alternatively, an absolute value of the first impurity amount difference may be equal to an absolute value of the second impurity amount difference.

In the semiconductor device, the value of the difference in impurity amount of the first column layer and the value of the difference in impurity amount of the second column layer are symmetric with each other with respect to zero. According to the result of simulation on the semiconductor device, the following are also symmetric with each other with respect to zero in graphs indicating the relation between the value of impurity amount and breakdown voltage: the value of difference in impurity amount at which breakdown voltage is maximized in a first graph related to the first column layer (the first graph is symmetric with respect to this value); and the value of difference in impurity amount at which breakdown voltage is maximized in a second graph related to the second column layer (the second graph is symmetric with respect to this value). For this reason, the following can be implemented in designing the breakdown voltage of a PN column layer comprised of a first column layer and a second column layer: it is possible to easily design a value of difference in impurity amount at which sufficient breakdown voltage can be ensured even when the above variation in formation is produced; and a stable percentage of non-defectives can be obtained in manufacture.

Alternatively, the first column layer may have a first thickness along with a stacking direction perpendicular to the horizontal direction, and the second column layer may have a second thickness along with the stacking direction. The first thickness is equal to the second thickness.

According to the result of simulation on the semiconductor device, the following are equal in the graphs indicating the relation between the value of impurity amount and breakdown voltage: the maximum value of breakdown voltage in the first graph related to the first column layer and the maximum value of breakdown voltage in the second graph related to the second column layer. Also for this reason, therefore, the following can be implemented in designing the breakdown voltage of a PN column layer comprised of a first column layer and a second column layer: it is possible to easily design a value of difference in impurity amount at which sufficient breakdown voltage can be ensured even when the above variation in formation is produced; and a stable percentage of non-defectives can be obtained in manufacture.

Alternatively, the PN column may further include a third column layer, which is disposed between the first column layer and the second column layer. The third column layer includes the first column having the first conductive type and the second column having the second conductive type. The first column and the second column in the third column layer are alternately arranged along with the horizontal direction parallel to a third boundary between the first column layer and the third column layer. The third column layer has a third impurity amount difference, which is defined at a predetermined depth from the third boundary by subtracting an impurity amount in the second column from an impurity amount in the first column. The third impurity amount difference is constant and positive, and the third impurity amount difference is smaller than the first impurity amount difference, and larger than the second impurity amount difference.

In the PN column layer of the semiconductor device, there is formed the third column layer having a difference in impurity amount between that of the first column layer and that of the second column layer. According to the result of simulation on the semiconductor device, a third graph related to the third column layer is inserted in the graphs indicating the relation between the value of impurity amount and breakdown voltage. The third graph has the value of difference in impurity amount at which breakdown voltage is maximized between the following values: the value of difference in impurity amount at which breakdown voltage is maximized in the first graph related to the first column layer; and the value of difference in impurity amount at which breakdown voltage is maximized in the second graph related to the second column layer. As the result of insertion of the third graph, therefore, the following can be implemented in designing the breakdown voltage of a PN column layer: it is possible to easily design a more accurate value of difference in impurity amount at which sufficient breakdown voltage can be ensured when the above variation in formation is produced; and a more stable percentage of non-defectives can be obtained in manufacture.

Further, the first column layer may have a first thickness along with a stacking direction perpendicular to the horizontal direction. The second column layer has a second thickness along with the stacking direction. The third column layer has a third thickness along with the stacking direction, and the third thickness is smaller than the first thickness and the second thickness.

The third column layer makes it possible to finely adjust the designed breakdown voltage of the above PN column layer comprised of a first column layer and a second column layer.

Further, the first column in the first column layer may have a constant impurity concentration, which is equal to a constant impurity concentration of the first column in the second column layer, and equal to a constant impurity concentration of the first column in the third column layer. The second column in the first column layer has a constant impurity concentration, which is equal to a constant impurity concentration of the second column in the second column layer, and equal to a constant impurity concentration of the second column in the third column layer. The first impurity amount difference is defined by subtracting a width of the second column from a width of the first column, the width of each first and second columns being defined along with the horizontal direction. The second impurity amount difference is defined by subtracting a width of the second column from a width of the first column, the width of each first and second columns being defined along with the horizontal direction, and the third impurity amount difference is defined by subtracting a width of the second column from a width of the first column, the width of each first and second columns being defined along with the horizontal direction.

In this semiconductor device, the following are implemented: the impurity concentration of the columns of the first conductivity type and that of the columns of the second conductivity type are set to a certain value; and the differences in impurity amount of the first column layer, second column layer, and third column layer are set by the difference in width between the columns of the first conductivity type and the columns of the second conductivity type in each column layer. According to this, it is possible to invariably set the impurity concentration when the columns of the first conductivity type and the column of the second conductivity type are formed and thus carry out stable film formation.

Further, the first column in the first column layer may have a constant width along with the horizontal direction, which is equal to a constant width of the first column in the second column layer, and equal to a constant width of the first column in the third column layer. The second column in the first column layer may have a constant width along with the horizontal direction, which is equal to a constant width of the second column in the second column layer, and equal to a constant width of the second column in the third column layer. The first impurity amount difference is defined by subtracting an impurity concentration of the second column from an impurity concentration of the first column. The second impurity amount difference is defined by subtracting an impurity concentration of the second column from an impurity concentration of the first column, and the third impurity amount difference is defined by subtracting an impurity concentration of the second column from an impurity concentration of the first column.

In this semiconductor device, the following are implemented: the width of the columns of the first conductivity type and that of the columns of the second conductivity type are set to a certain value; and the differences in impurity amount of the first column layer, second column layer, and third column layer are set by the difference in impurity concentration between the columns of the first conductivity type and the column of the second conductivity type in each column layer. According to this, it is possible to simplify a trench formation process when the columns of the first conductivity type or the columns of the second conductivity type are formed and thus suppress increase in manufacturing cost.

Alternatively, the semiconductor device may further include a trench that penetrates the second semiconductor layer and reaches the first column; and a gate electrode in the trench via an insulation film. The first semiconductor layer provides a channel so that the semiconductor device provides a vertical insulated gate transistor.

Alternatively, the first column in the first column layer may have a constant impurity concentration, which is equal to a constant impurity concentration of the first column in the second column layer, and the second column in the first column layer may have a constant impurity concentration, which is equal to a constant impurity concentration of the second column in the second column layer. The constant impurity concentration of the first column in the first column layer is equal to the constant impurity concentration of the second column in the first column layer. The first impurity amount difference is defined by subtracting a width of the second column from a width of the first column, the width of each first and second columns being defined along with the horizontal direction, and the second impurity amount difference is defined by subtracting a width of the second column from a width of the first column, the width of each first and second columns being defined along with the horizontal direction. Further, an absolute value of the first impurity amount difference may be equal to an absolute value of the second impurity amount difference. The first column layer has a first thickness along with a stacking direction perpendicular to the horizontal direction. The second column layer has a second thickness along with the stacking direction, and the first thickness is equal to the second thickness.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a first semiconductor layer having a first conductive type;
a PN column layer disposed on the first semiconductor layer; and
a second semiconductor layer having a second conductive type and disposed on the PN column layer,
wherein the PN column layer includes a first column layer and a second column layer,
wherein the first column layer is disposed on the first semiconductor layer, and the second column layer is disposed between the first column layer and the second semiconductor layer,
wherein each of the first column layer and the second column layer includes a first column having the first conductive type and a second column having the second conductive type,
wherein the first column and the second column in the first column layer are alternately arranged along with a horizontal direction parallel to a first boundary between the PN column layer and the first semiconductor layer,
wherein the first column and the second column in the second column layer are alternately arranged along with the horizontal direction parallel to a second boundary between the PN column layer and the second semiconductor layer,
wherein the first column layer has a first impurity amount difference, which is defined at a predetermined depth from the first boundary by subtracting an impurity amount in the second column from an impurity amount in the first column,
wherein the second column layer has a second impurity amount difference, which is defined at a predetermined depth from a second boundary between the PN column layer and the second semiconductor layer by subtracting an impurity amount in the second column from an impurity amount in the first column,
wherein the first impurity amount difference is constant and positive, and
wherein the second impurity amount difference is constant and negative.

2. The semiconductor device according to claim 1,
wherein an absolute value of the first impurity amount difference is equal to an absolute value of the second impurity amount difference.

3. The semiconductor device according to claim 1,
wherein the first column layer has a first thickness along with a stacking direction perpendicular to the horizontal direction,
wherein the second column layer has a second thickness along with the stacking direction, and
wherein the first thickness is equal to the second thickness.

4. The semiconductor device according to claim 1,
wherein the PN column further includes a third column layer, which is disposed between the first column layer and the second column layer,
wherein the third column layer includes the first column having the first conductive type and the second column having the second conductive type,
wherein the first column and the second column in the third column layer are alternately arranged along with the horizontal direction parallel to a third boundary between the first column layer and the third column layer,
wherein the third column layer has a third impurity amount difference, which is defined at a predetermined depth from the third boundary by subtracting an impurity amount in the second column from an impurity amount in the first column,
wherein the third impurity amount difference is constant and positive, and
wherein the third impurity amount difference is smaller than the first impurity amount difference, and larger than the second impurity amount difference.

5. The semiconductor device according to claim 4,
wherein the first column layer has a first thickness along with a stacking direction perpendicular to the horizontal direction,
wherein the second column layer has a second thickness along with the stacking direction,
wherein the third column layer has a third thickness along with the stacking direction, and
wherein the third thickness is smaller than the first thickness and the second thickness.

6. The semiconductor device according to claim 4,
wherein the first column in the first column layer has a constant impurity concentration, which is equal to a constant impurity concentration of the first column in the second column layer, and equal to a constant impurity concentration of the first column in the third column layer,
wherein the second column in the first column layer has a constant impurity concentration, which is equal to a constant impurity concentration of the second column in the second column layer, and equal to a constant impurity concentration of the second column in the third column layer,
wherein the first impurity amount difference is defined by subtracting a width of the second column from a width of the first column, the width of each first and second columns being defined along with the horizontal direction,
wherein the second impurity amount difference is defined by subtracting a width of the second column from a width of the first column, the width of each first and second columns being defined along with the horizontal direction, and wherein the third impurity amount difference is defined by subtracting a width of the second column from a width of the first column, the width of each first and second columns being defined along with the horizontal direction.

7. The semiconductor device according to claim 4, wherein the first column in the first column layer has a constant width along with the horizontal direction, which is equal to a constant width of the first column in the second column layer, and equal to a constant width of the first column in the third column layer, wherein the second column in the first column layer has a constant width along with the horizontal direction, which is equal to a constant width of the second column in the second column layer, and equal to a constant width of the second column in the third column layer, wherein the first impurity amount difference is defined by subtracting an impurity concentration of the second column from an impurity concentration of the first column, wherein the second impurity amount difference is defined by subtracting an impurity concentration of the second column from an impurity concentration of the first column, and wherein the third impurity amount difference is defined by subtracting an impurity concentration of the second column from an impurity concentration of the first column.

8. The semiconductor device according to claim 1, further comprising:
   a trench that penetrates the second semiconductor layer and reaches the first column; and
   a gate electrode in the trench via an insulation film,
   wherein the first semiconductor layer provides a channel so that the semiconductor device provides a vertical insulated gate transistor.

9. The semiconductor device according to claim 1, wherein the first column in the first column layer has a constant impurity concentration, which is equal to a constant impurity concentration of the first column in the second column layer, wherein the second column in the first column layer has a constant impurity concentration, which is equal to a constant impurity concentration of the second column in the second column layer, wherein the constant impurity concentration of the first column in the first column layer is equal to the constant impurity concentration of the second column in the first column layer, wherein the first impurity amount difference is defined by subtracting a width of the second column from a width of the first column, the width of each first and second columns being defined along with the horizontal direction, and wherein the second impurity amount difference is defined by subtracting a width of the second column from a width of the first column, the width of each first and second columns being defined along with the horizontal direction.

10. The semiconductor device according to claim 9, wherein an absolute value of the first impurity amount difference is equal to an absolute value of the second impurity amount difference, wherein the first column layer has a first thickness along with a stacking direction perpendicular to the horizontal direction, wherein the second column layer has a second thickness along with the stacking direction, and wherein the first thickness is equal to the second thickness.

* * * * *